United States Patent
Minamide et al.

(10) Patent No.: US 8,119,308 B2
(45) Date of Patent: Feb. 21, 2012

(54) PHOTOMASK, APPARATUS FOR MANUFACTURING SEMICONDUCTOR DEVICE HAVING THE PHOTOMASK, AND METHOD OF MANUFACTURING SEMICONDUCTOR DEVICE USING THE PHOTOMASK

(75) Inventors: Ayumi Minamide, Tokyo (JP); Akemi Moniwa, Tokyo (JP); Junjiro Sakai, Tokyo (JP); Manabu Ishibashi, Itami (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 183 days.

(21) Appl. No.: 12/394,296

(22) Filed: Feb. 27, 2009

(65) Prior Publication Data

US 2009/0239159 A1    Sep. 24, 2009

(30) Foreign Application Priority Data

Mar. 21, 2008 (JP) ................................. 2008-073264

(51) Int. Cl.
*G03F 1/00* (2006.01)
(52) U.S. Cl. .............................. 430/5; 430/311; 430/394

(58) Field of Classification Search .............. 430/5, 311, 430/394; 716/19
See application file for complete search history.

(56) References Cited

U.S. PATENT DOCUMENTS

| | | | |
|---|---|---|---|
| 5,242,770 A | 9/1993 | Chen et al. | |
| 5,447,810 A | 9/1995 | Chen et al. | |
| 5,821,014 A | 10/1998 | Chen et al. | |
| 6,413,683 B1 | 7/2002 | Liebmann et al. | |
| 6,703,167 B2 | 3/2004 | LaCour | |
| 2006/0057475 A1* | 3/2006 | Liebmann et al. | 430/5 |
| 2006/0188791 A1* | 8/2006 | O'Brien et al. | 430/5 |

* cited by examiner

*Primary Examiner* — Mark F Huff
*Assistant Examiner* — Rashid Alam
(74) *Attorney, Agent, or Firm* — Miles & Stockbridge P.C.

(57) ABSTRACT

A photomask is disclosed which can suppress deterioration of the depth of focus even in the case where main features are arranged randomly. Sub-features are replaced by a quadrangular sub-feature located inside an external quadrangle which includes as part of its outer periphery the outermost portions of the original sub-features. The sub-feature after the replacement is preferably in a square shape and the length of one side thereof is determined in accordance with the length of the associated external quadrangle. A central position of the sub-feature after the replacement is preferably coincident with the center of the external quadrangle or the center of gravity of the region which includes the original sub-features.

20 Claims, 18 Drawing Sheets

FIG. 8(a)
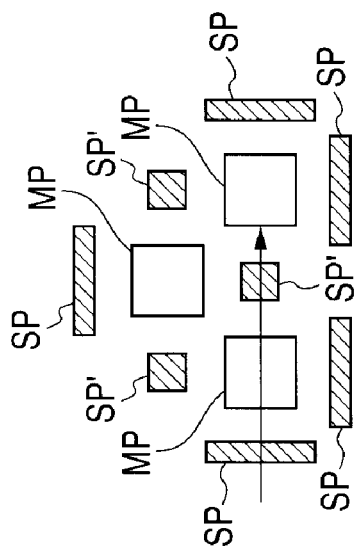
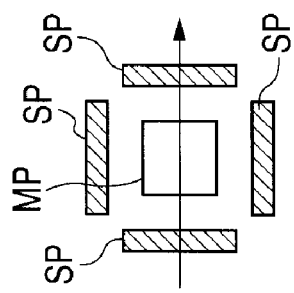
FIG. 8(b)
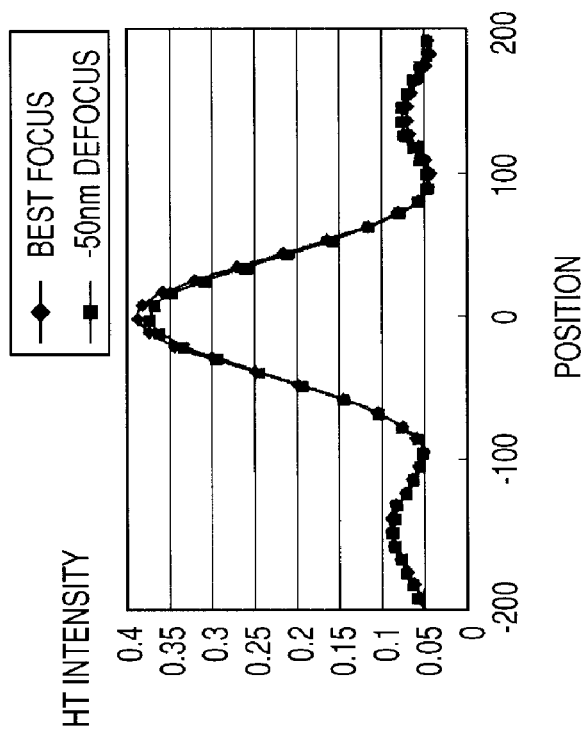
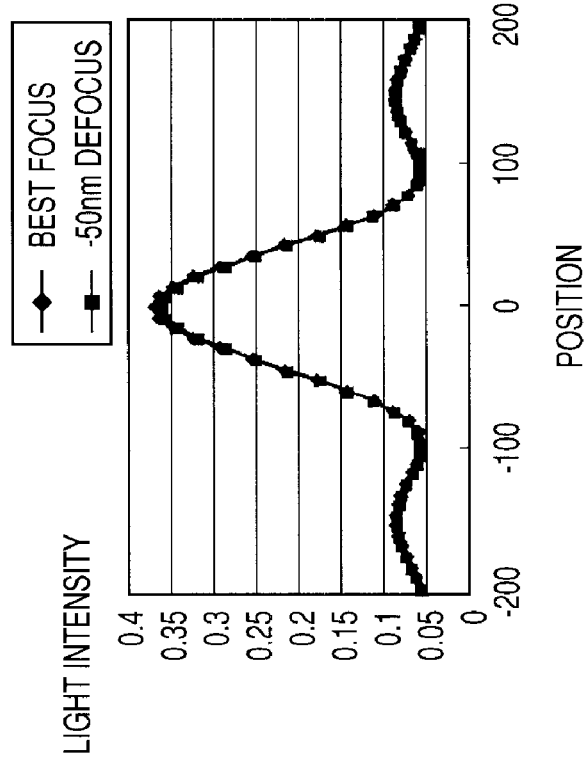

FIG. 14(a)
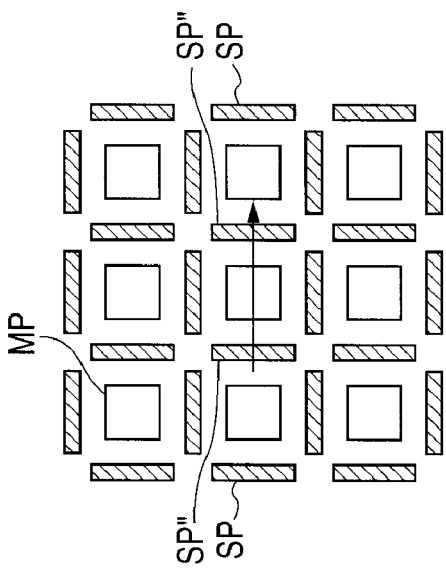
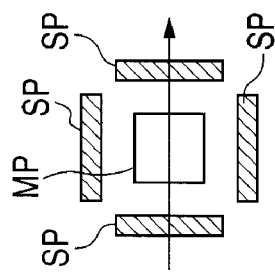
FIG. 14(b)
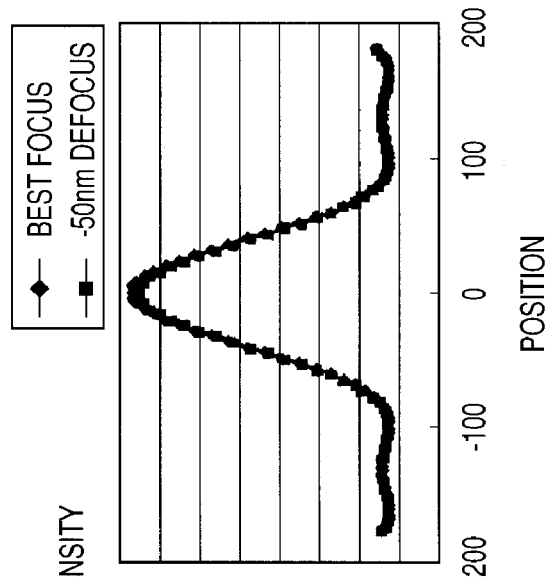
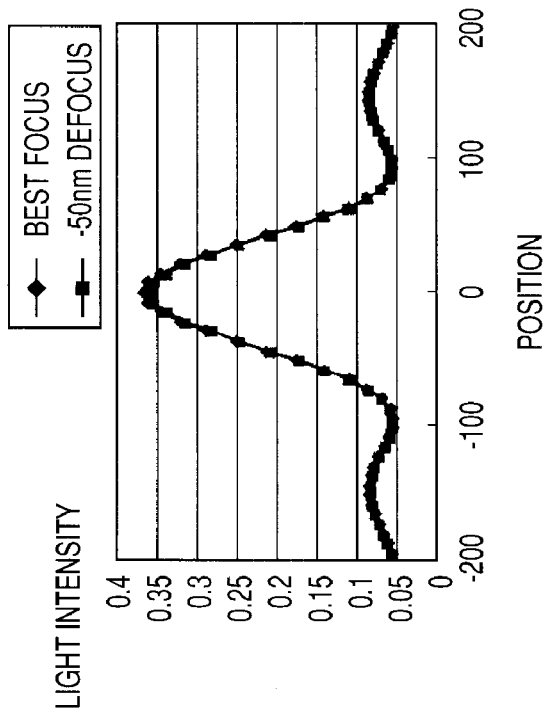

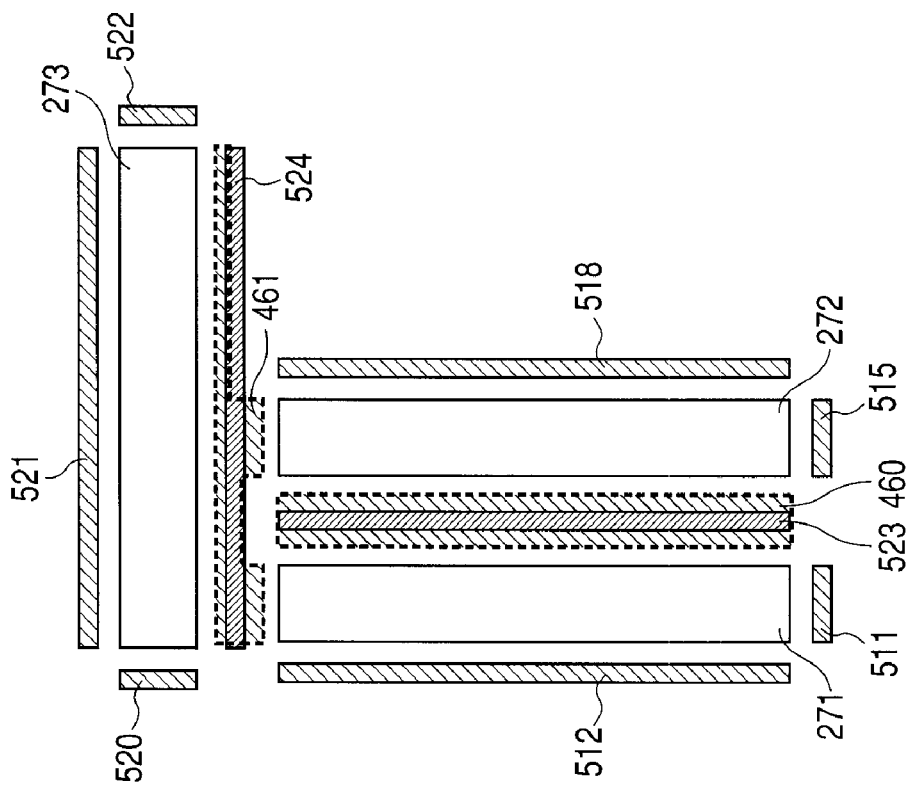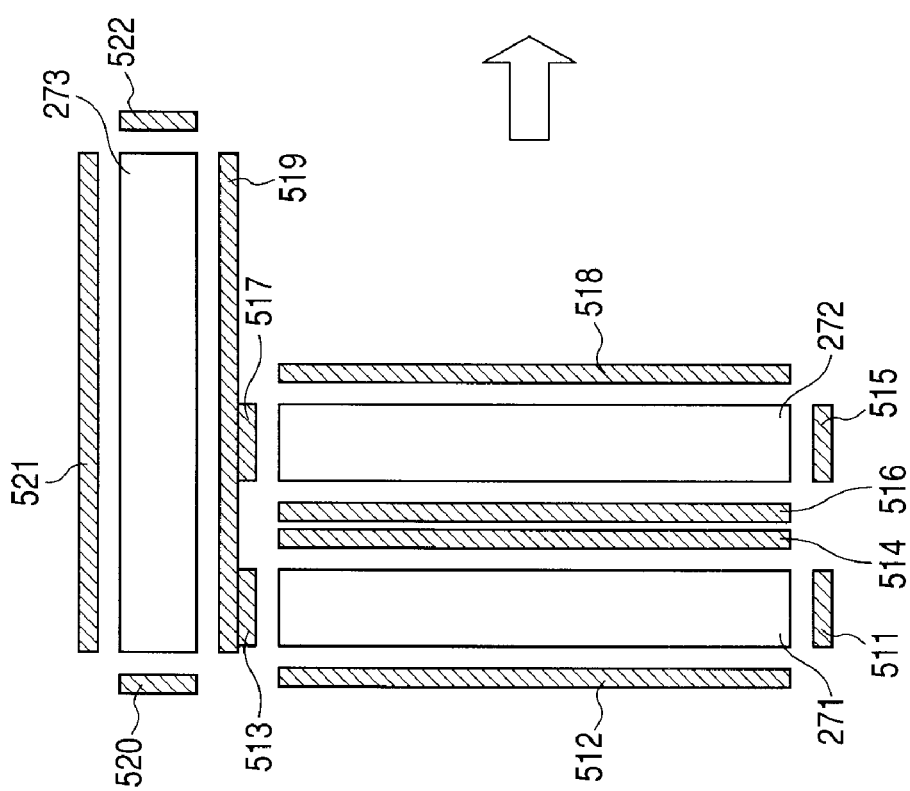

PHOTOMASK, APPARATUS FOR MANUFACTURING SEMICONDUCTOR DEVICE HAVING THE PHOTOMASK, AND METHOD OF MANUFACTURING SEMICONDUCTOR DEVICE USING THE PHOTOMASK

CROSS-REFERENCE TO RELATED APPLICATIONS

The disclosure of Japanese Patent Application No. 2008-73264 filed on Mar. 21, 2008 including the specification, drawings and abstract is incorporated herein by reference in its entirety.

BACKGROUND OF THE INVENTION

The present invention relates to a photomask for the transfer of features onto a substrate with use of an exposure unit, a semiconductor device manufacturing system having the photomask, and a semiconductor device manufacturing method using the photomask. Particularly, the present invention is concerned with a photomask having a main feature and sub-features formed in proximity to the main feature.

With advance of the semiconductor device manufacturing technique and by the lithography process, circuit patterns formed on a substrate are becoming more and more fine in size. In the lithography process, using an exposure unit, light emitted from a light source is radiated to a photomask formed with features (hereinafter referred to also as "main feature" or "designed feature") to be transferred (resolved) onto a wafer, whereby features corresponding to a circuit is transferred onto the substrate (wafer).

For forming a finer circuit pattern it is necessary to transfer features with a high resolution having a sufficient depth of focus (DOF). However, light obtained by passage through a main feature arranged isolatedly cannot afford a sufficient depth of focus due to the wavelength thereof being finite. In this connection there is known a method using a photomask having not only a main feature but also sub-features as sub-resolution assist features (SRAF) arranged near the main feature to improve resolution.

For example, in the specification of U.S. Pat. No. 5,821,014 (Patent Literature 1), the specification of U.S. Pat. No. 5,447,810 (Patent Literature 2) and the specification of U.S. Pat. No. 5,242,770 (Patent Literature 3) it is disclosed that sub-features are arranged at positions apart from the sides of an isolated feature so as to approach the optical profile of massed features.

Attention is now being paid to SoC (System on a Chip) with both logic circuit and memory module formed on the same chip. In the layout of SoC there are included many random patterns. If the aforesaid layout rule of sub-features is applied to such a layout, there can occur a case where a sub-feature overlaps the main feature or sub-feature overlap each other. As a countermeasure to such a conflicted case of sub-features, in the specification of U.S. Pat. No. 6,703,167 (Patent Literature 4) and the specification of U.S. Pat. No. 6,413,683 (Patent Literature 5) there is disclosed a method wherein priorities are given to sub-features, and deformation and/or deletion of sub-features are performed in accordance with the order of priority. Particularly, it is disclosed therein that the transfer of a sub-feature not to be resolved onto a wafer, (intended extra image of SRAF), is prevented by deleting a perpendicularly intersecting portion of sub-features.

[Patent Literature 1]
Specification of U.S. Pat. No. 5,821,014
[Patent Literature 2]
Specification of U.S. Pat. No. 5,447,810
[Patent Literature 3]
Specification of U.S. Pat. No. 5,242,770
[Patent Literature 4]
Specification of U.S. Pat. No. 6,703,167
[Patent Literature 5]
Specification of U.S. Pat. No. 6,413,683

SUMMARY OF THE INVENTION

However, if priorities are given to sub-features and one which is low in the order of priority is transformed or deleted as disclosed in the specification of U.S. Pat. No. 6,703,167 (Patent Literature 4) or the specification of U.S. Pat. No. 6,413,683 (Patent Literature 5), there arises a bad influence that the depth of focus of the main feature to which the sub-feature belongs is deteriorated despite the order of priority of the sub-feature being low. Particularly, in the case where a perpendicularly intersecting sub-feature portion is deleted, the depth of focus of the main feature close to the perpendicularly intersecting portion is deteriorated.

The present invention has been accomplished for solving the above-mentioned problem and it is an object of the invention to provide a photomask capable of suppressing deterioration of the depth of focus even in the case where main features are arranged randomly, as well as a semiconductor device manufacturing system having the photomask and a semiconductor device manufacturing method using the photomask.

A photomask embodying the present invention includes a plurality of main feature, a plurality of first sub-features and a second sub-feature. The main features are arranged at positions corresponding to features to be transferred to a substrate. The first sub-features are associated with any of sides of the main features and are arranged at positions spaced a predetermined distance from the associated sides. The second sub-feature is arranged at a position associated with the first sub-features which form a mutually overlapping portion when arranged virtually. The second sub-feature is arranged as a substitute for such first sub-features. Attributes of the second sub-feature are determined on the basis of all of attributes of the virtually arranged first sub-features associated with the second sub-feature.

A photomask embodying the present invention includes a plurality of main features, a plurality of first sub-features and a second sub-feature. The main features are arranged at positions corresponding to features to be transferred to a substrate. The first sub-features are associated with any of sides of the main features and are arranged at positions spaced a predetermined distance from the associated sides. The second sub-feature is arranged as a substitute for the first sub-features at a position associated with the first sub-features which are close substantially in parallel to each other when arranged virtually. Attributes of the second sub-feature are determined on the basis of all of attributes of the virtually arranged first sub-features associated with the second sub-feature.

A semiconductor device manufacturing system embodying the present invention has the photomask described above. A semiconductor device manufacturing method embodying the present invention uses the above photomask for the transfer of patterns.

According to the present invention it is possible to suppress the deterioration of the depth of focus even in the case where main features are arranged randomly.

BRIEF DESCRIPTION OF THE DRAWINGS

FIG. 8 is a diagram showing effects based on the measures of the first rule embodying the present invention;

FIG. 14 is a diagram showing effects based on the measures of the second rule embodying the present invention;

FIG. 17 is a diagram explaining the measures of a second modification of the second rule embodying the present invention;

DETAILED DESCRIPTION OF PREFERRED EMBODIMENTS

Figure 1:
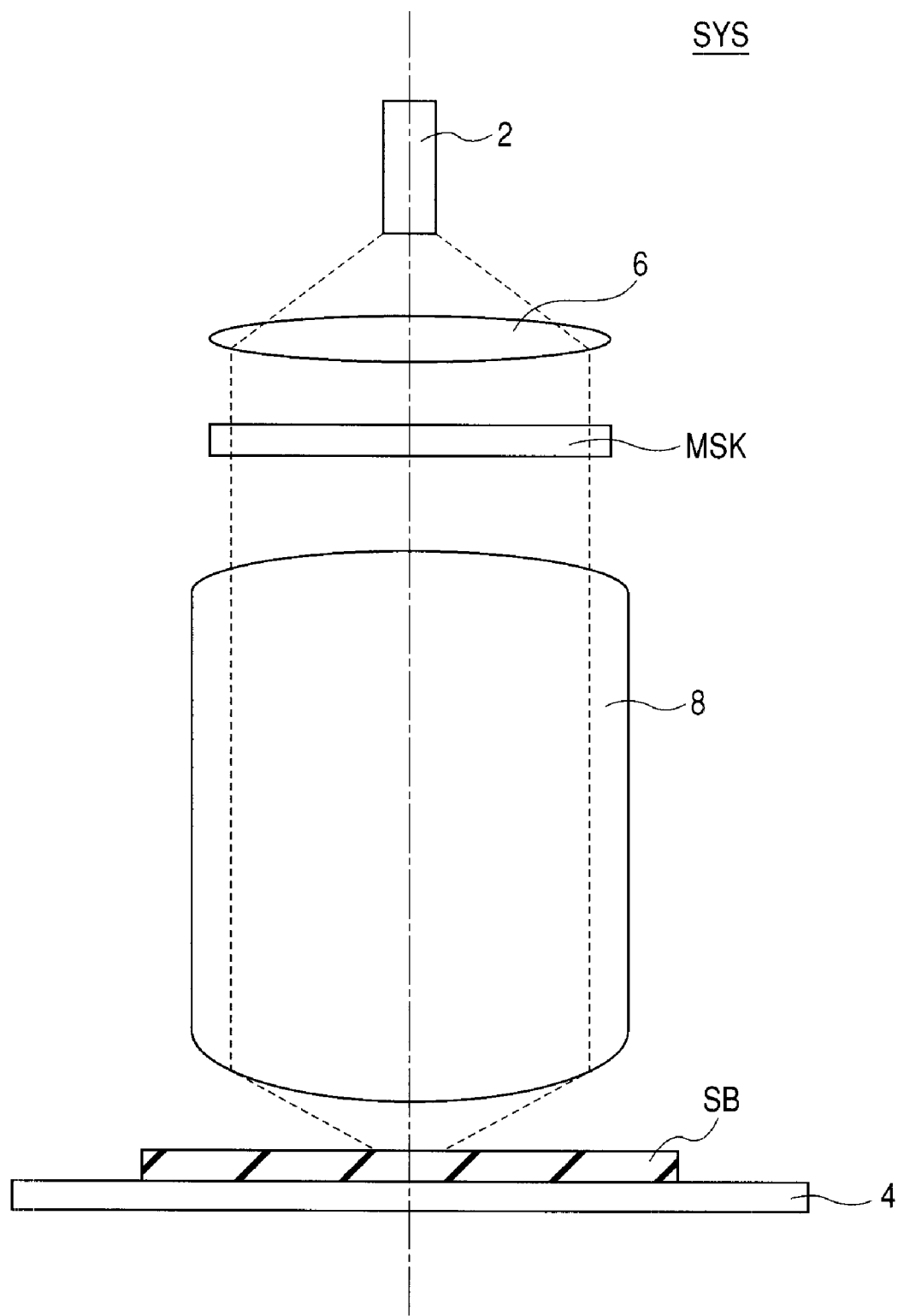
FIG. 1 is a schematic configuration diagram of a semiconductor device manufacturing system embodying the present invention.

Embodiments of the present invention will be described below in detail with reference to the accompanying drawings. The same or corresponding portions in the drawings are identified by the same reference numerals, and repeated explanations thereof will be omitted.

<System Configuration>

FIG. 1 is a schematic configuration diagram of a semiconductor device manufacturing system SYS embodying the present invention.

Referring to FIG. 1, in the semiconductor device manufacturing system SYS embodying the present invention, an exposure pattern produced by a photomask MSK is transferred to a resist which is a photosensitive material placed on a wafer SB, thereby forming a circuit pattern on the wafer SB. The semiconductor device manufacturing system SYS is comprised of a light source 2 adapted to emit light for producing an exposure pattern, a lens system 6, a photomask MSK having a main feature corresponding to a circuit pattern to be transferred onto the wafer SB, a projection lens system 8, and a sample table 4 on which the wafer SB is placed. The light source 2 according to this embodiment is a single light source having a wavelength of 193 nm as an example.

The manufacturing system SYS includes an exposure unit called stepper as an example, whereby an exposure pattern, which is produced by passage of the light from the light source 2 through the photomask MSK, is contracted by the projection lens system 8 and the thus-contracted pattern is transferred onto the wafer SB. Therefore, a finer feature in comparison with the feature formed on the photomask MSK can be formed on the wafer SB. Since the structure and operation of such a manufacturing system SYS are well known, a more detailed explanation thereof will here be omitted.

Particularly, as to the photomask MSK used in the manufacturing system SYS according to this embodiment, its layout is determined and the mask produced in accordance with the following procedure.

<Sub-Feature>

The photomask MSK includes a feature (hereinafter referred to as "main feature" or "design feature") arranged at a position corresponding to an exposure pattern to be transferred onto the wafer SB and sub-features sas sub-resolution assist features (SRAF) associated with the sides of the main feature. The following description is now provided about the effect of the sub-resolution assist features (SRAF).

Figure 2:
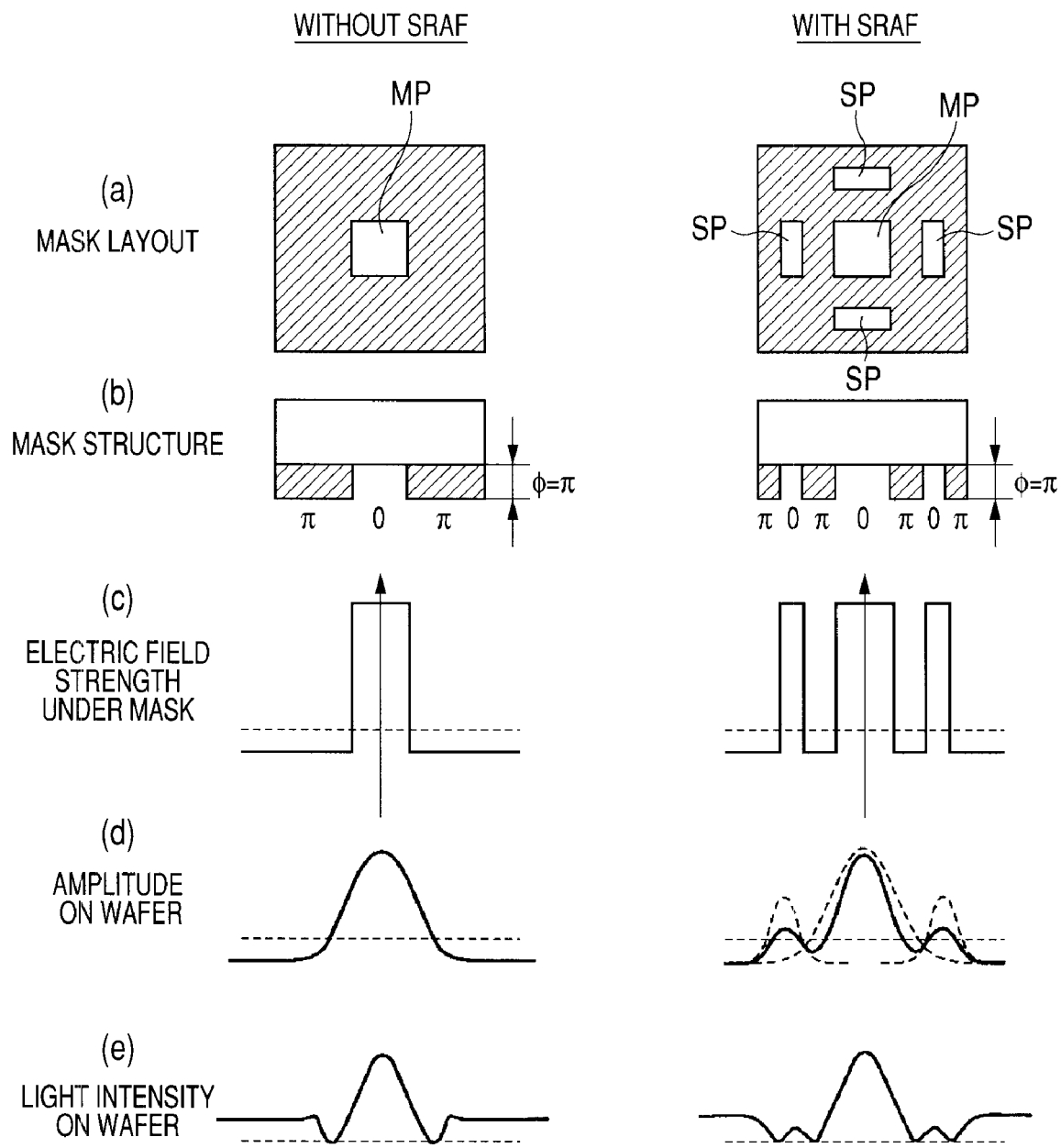
FIG. 2 is a diagram for explaining an improvement of optical characteristics attained by using a sub-resolution assist feature (SRAF)

FIG. 2 is a diagram for explaining an improvement of optical characteristics attained by the sub-resolution assist features (SRAF). FIG. 2 shows a comparison between a photomask with only a square main feature MP formed centrally of the mask and a photomask with four sub-features SP as sub-resolution assist features (SRAF) arranged at positions spaced a predetermined distance from the four sides of the main feature in association with the four sides. Each photomask shown in FIG. 2 is assumed to be an attenuated type phase shift photomask and a dark field mask using the main feature portion as a light transmitting portion is illustrated as an example. However, it is known that the improvement of optical characteristics attained by sub-resolution assist features is effective not only for the ordinary binary mask but also for a clear field mask using a main feature as a light opaque portion.

The main feature MP and the sub-features SP are regions higher in transmittance than other regions. More specifically, the transmittance is adjusted by controlling the phase for incident light.

The main feature MP is formed in such a size as permits a sufficient amount of light to pass therethrough. When light emitted from a light source is radiated to the photomask, there is produced an exposed feature having, in its light intensity profile, a high light intensity in the region corresponding to the main feature MP.

On the other hand, the sub-features SP auxiliarily generate light having a higher degree so as to enlarge the depth of focus of the exposed feature which has been produced by the main feature n MP. This is because with only the light passing through the isolatedly-formed main feature MP it is impossible to obtain a sufficient resolution. Since the sub-features have a similar transmittance to that of the main feature MP, they assist the formation of an exposed feature corresponding to the main feature MP and are set in a size (not larger than a resolution limit) in which the light having passed through the sub-features SP is not resolved on the wafer.

The phenomenon of being resolved and the phenomenon of not being resolved depends on numerical aperture of the projection lens system 8 and the wavelength of light emitted from the light source 2. Generally, given that the wavelength of light emitted from the light source 2 is $\lambda$, numerical aperture of lens is NA and a proportional coefficient determined by process is k1, the resolution can be expressed as k1×$\lambda$/NA. Therefore, an aperture area (the area of a high transmittance region) of the main feature and that of the sub-feature s can be determined in accordance with the expression indicative of resolution and also according to both wavelength $\lambda$ of emitted light and numerical aperture NA of lens.

By forming such sub-features SP in proximity to the main feature MP it is seen that the profile of the exposed feature on the wafer changes more steeply (see FIG. 2(e)).

<Pattern Data Producer>

Such a layout of photomask MSK as described above is typically produced by a computer-based pattern data producer.

Figure 3:
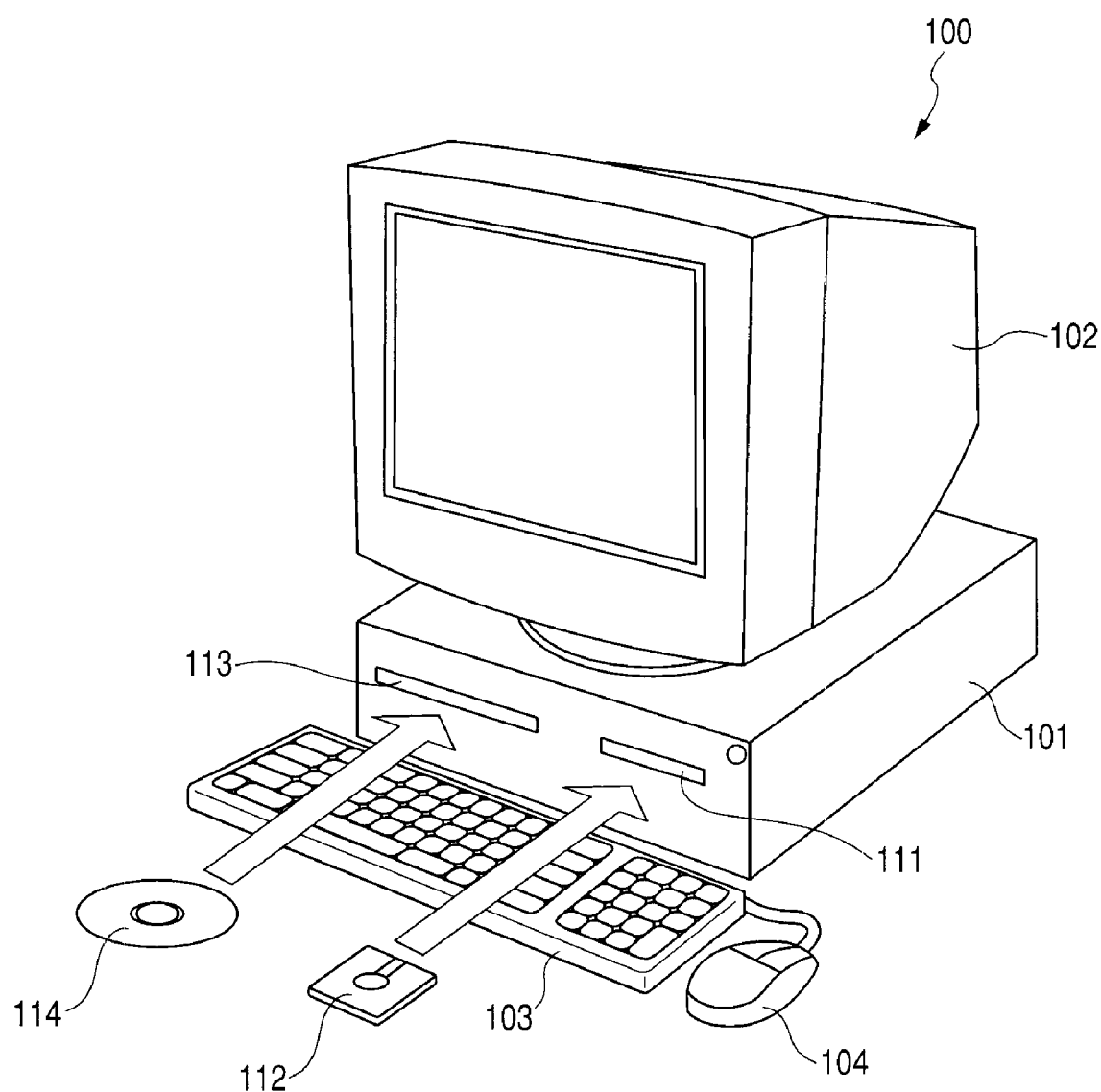
FIG. 3 is a perspective view showing a computer as a typical hardware configuration for implementing a pattern data producing system embodying the present invention.
Figure 4:
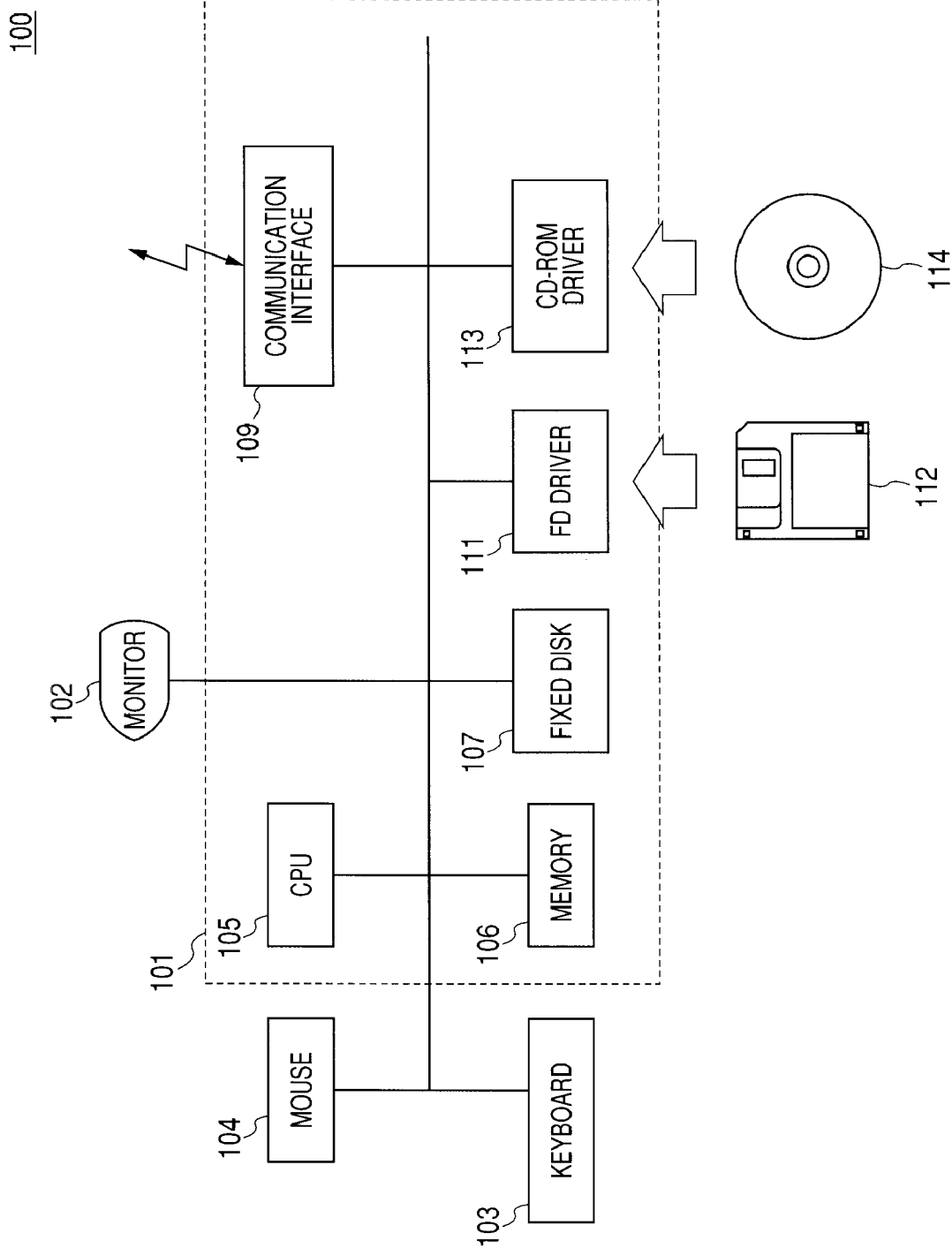
FIG. 4 is a schematic configuration diagram showing a hardware configuration of the computer.

FIG. 3 is a perspective view showing a computer 100 which is a typical hardware configuration for implementing the pattern data producer embodying the present invention. FIG. 4 is a schematic configuration diagram showing a hardware configuration of the computer 100.

With reference to FIG. 3, the computer 100 includes a computer body 101, the computer body 101 carrying thereon an FD (Flexible Disk) driver 111 and a CD-ROM (Compact Disk-Read Only Memory) driver 113, a monitor 102, a keyboard 103 and a mouse 104.

With reference to FIG. 4, the computer body 101 includes, in addition to the FD driver 111 and CD-ROM driver 113, a CPU (Central Processing Unit) 105 as an arithmetic unit, a memory 106, a fixed disk 107 as a storage unit, and a communication interface 109 coupled to each other by a bus.

The pattern data producer according to this embodiment is implemented by execution of a program with CPU 105 which is performed using such a computer hardware as memory 106. Generally, such a program is stored in a storage medium such as, for example, FD 112 or CD-ROM 114 and distributes through a network or the like. Such a program is read from the storage medium by, for example, the FD driver 111 or the CD-ROM driver 113, or is received by the communication interface 109, and is stored in the fixed disk 107. Further, such a program is read from the fixed disk 107 to the memory 106 and is executed by the CPU 105.

The CPU 105, which is an arithmetic processing section, executes programmed instructions in order and thereby determines the layout of the photomask MSK according to this embodiment. The memory 106 stores various information pieces in accordance with the execution of program by the CPU 105.

The monitor 102 is a display section for the display of information outputted from the CPU 105. As an example, the monitor 102 is comprised of LCD (Liquid Crystal Display) or CRT (Cathode Ray Tube). That is, a layout of photomask MSK during preparation of after completion is displayed on the monitor 102.

The mouse 104 accepts a command from a user in accordance with operation such as click or slide. The keyboard 103 accepts a command from the user in accordance with inputted keys.

The communication interface 109 is a device for establishing communication between the computer 100 and other devices. The communication interface 109 accepts data of a main feature (designed pattern) corresponding to a circuit pattern to be formed on the wafer SB and outputs pattern data of the determined layout of photomask MSK to the exterior.

The photomask MSK is prepared on the basis of pattern data outputted from the pattern data producer described above. As to the actual photomask MSK preparing process it is possible to use a known technique.

<Entire Processing>

Figure 5:
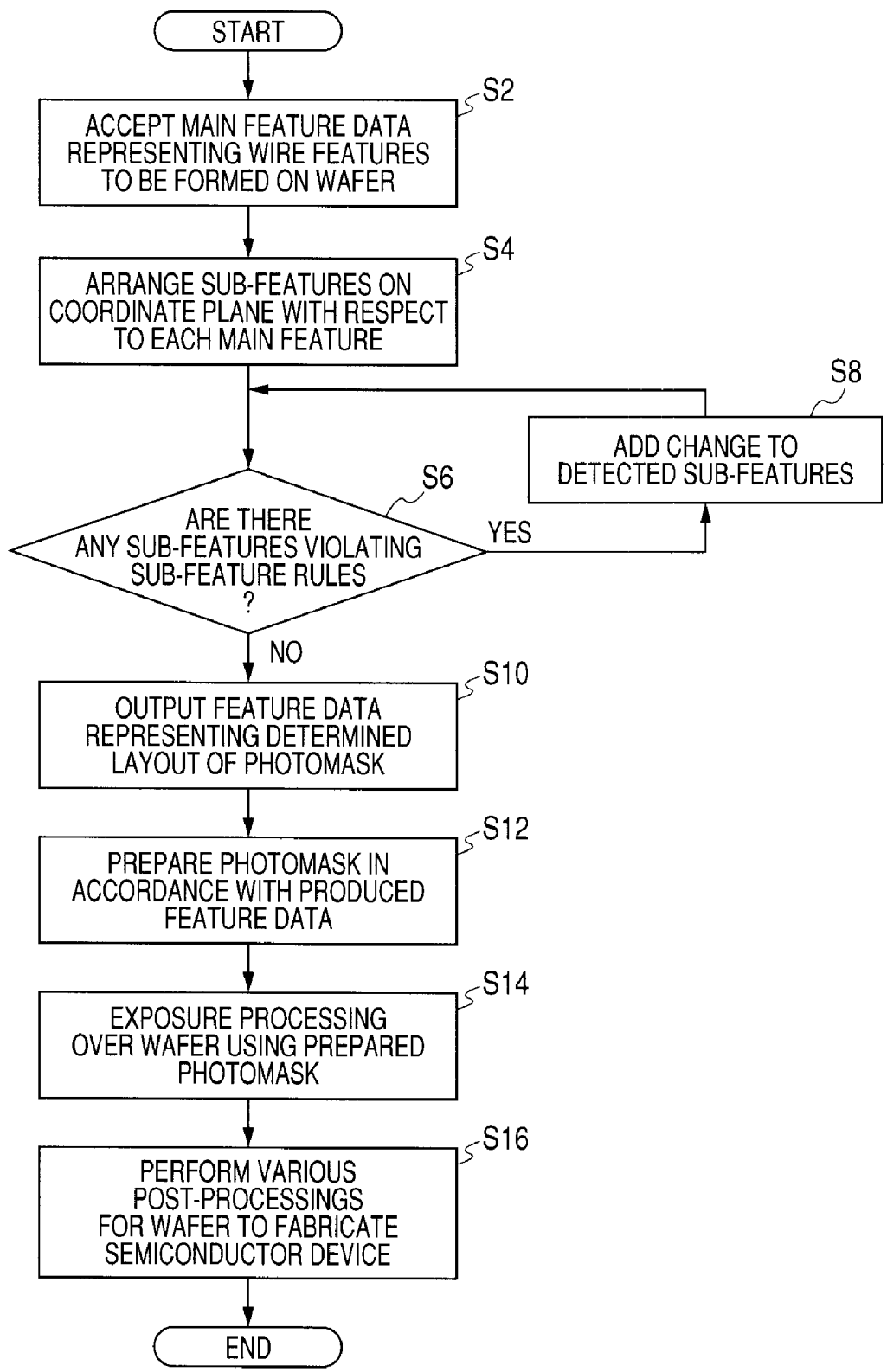
FIG. 5 is a flow chart showing a processing procedure in a semiconductor device manufacturing method embodying the present invention.

With reference to FIG. 5, a description will be given below about a processing procedure related to the semiconductor device manufacturing method according to this embodiment.

FIG. 5 is a flow chart showing the processing procedure.

With reference to FIG. 5, a layout of photomask MSK is determined by the pattern data producer described above. More specifically, the pattern data producer accepts main feature data representing a circuit pattern to be formed on the wafer SB (step S2). The pattern data producer develops and arranges the thus-accepted pattern data virtually on a coordinate plane. Next, in accordance with a predetermined sub-pattern layout rule the pattern data producer arranges sub-features on the coordinate plane with respect to each main feature (step S4). Further, the pattern data producer determines whether a sub-feature rule offense exists or not (step S6). The sub-feature rule offense includes a case where virtually arranged sub-features give rise to an overlapping portion or a case where they are too close to one another.

When there exists a sub-feature rule offense (YES in step S6), the pattern data producer adds a change to the detected sub-feature (step S8) and again determines whether there exists a sub-feature rule offense (step S6).

On the other hand, unless there exists a sub-feature rule offense (NO in step S6), the pattern data producer determines the present layout to be the layout of photomask MSK and outputs pattern data representing the thus-determined photomask layout (step S10). At this stage, optical proximity correction (OPC) may be done for the main feature. OPC may be done without changing the sub-feature shape determined in step S6 or a fine adjustment of the sub-feature shape or position may be done at the same time.

As to the object of the sub-feature rule offense, an arbitrary one may be adopted from among plural rules to be described later and it is not always necessary to adopt all rules. Also as to the processing for determining a rule offense of a sub-feature, it can be executed in a serial or parallel manner.

Thereafter, a photomask MSK is prepared in accordance with the pattern data produced by the pattern data producer (step S12). Then, using the photomask MSK thus prepared, there is performed an exposure processing for the upper surface of the wafer SB (step S14). Further, various post-processings are carried out for the wafer SB, whereby a semiconductor device is manufactured (step S16).

Particularly, the pattern data producer according to this embodiment replaces plural sub-features of rule offense with one sub-feature. In this replacement, attributes such as size, shape and position of the sub-feature after the replacement are determined without giving priorities to the sub-features concerned. That is, attributes of the sub-feature after the replacement are determined on the basis of the attributes of all the sub-features concerned. Deterioration of the depth of focus is suppressed by such a replacement. As a result, even in the case where main features are arranged randomly, the depth of focus is not deteriorated and it is possible to avoid dummy transfer of a sub-feature (exposure of an unnecessary portion).

The following description is now provided about the contents of the sub-feature rule offense described in steps S6 and S8 and the contents of measures taken against rule offenses.
<First Rule>

Figure 6:
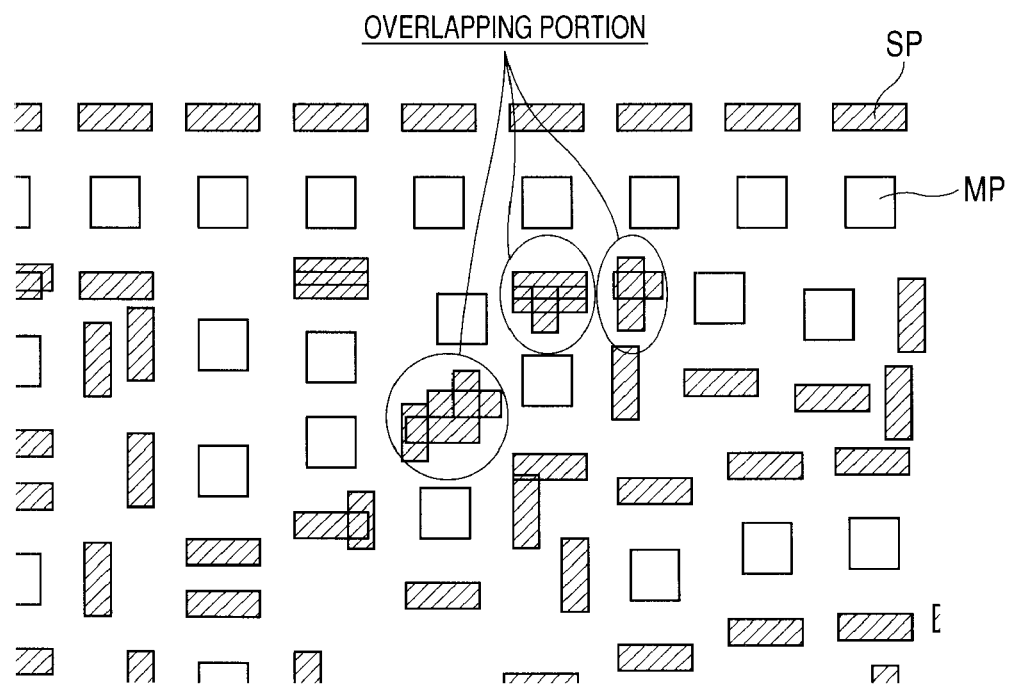
FIG. 6 is a diagram showing an example of layout in case of arranging sub-features in accordance with a predetermined sub-feature layout rule with respect to main features arranged randomly.

FIG. 6 shows an example of layout in which sub-features SP are arranged in accordance with a predetermined sub-feature layout rule with respect to main features MP arranged randomly.

Referring to FIG. 6, main features MP are formed in a quadrangular shape having an each side length of 50-90 nm as an example. According to the predetermined sub-feature layout rule, sub-features SP having an unresolving width (20-70 nm) are arranged on a wafer in parallel with corresponding sides of each main feature MP at positions associated with the MP sides and spaced 100-200 nm from the center of each main feature MP. The length in the longitudinal direction of each sub-feature SP is 80-150 nm as an example.

According to this sub-feature layout rule there can occur an overlapping portion of plural sub-features SP. It is determined that such an overlapping of sub-features SP is a rule offense. In connection with such an overlapping portion of sub-features SP, the first rule is a measures against the case where sub-features SP intersect or contact each other substantially perpendicularly in their longitudinal directions ("overlapping portions" in FIG. 6).

Figure 7:
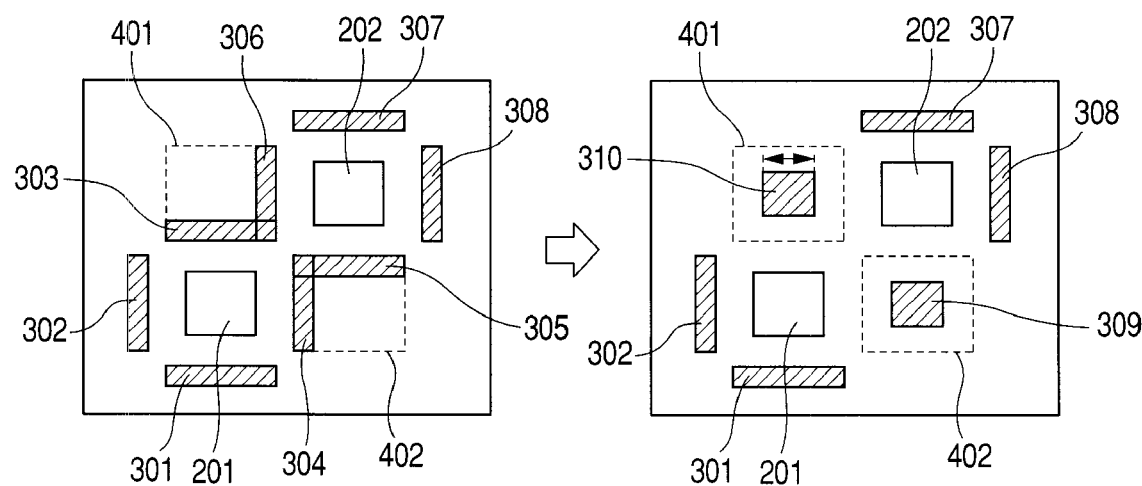
FIG. 7 is a diagram explaining the measures of a first rule embodying the present invention.

FIG. 7 is a diagram explaining the measures of the first rule embodying the present invention. In the photomask shown in FIG. 7 there are arranged main features 201 and 202 and further arranged are sub-features 301, 302, 303 and 304 associated with the main feature 201 and sub-features 305, 306, 307 and 308 associated with the main feature 202. In this photomask, the sub-features 303 and 306 intersect each other perpendicularly in their longitudinal directions and so do the sub-features 304 and 305.

According to the first rule, plural sub-features intersecting each other substantially perpendicularly in their longitudinal directions, i.e., orthogonal sub-features, are replaced by a sub-feature different in size, shape and layout position from those sub-features. More specifically, according to the first rule, an external quadrangle whose outer periphery includes the outermost portions of the orthogonal sub-features is defined virtually and a substitute sub-feature different in at least one of size and shape from the original sub-features is arranged inside the external quadrangle.

In the example shown in FIG. 7, the sub-features 303 and 306 are replaced by a square sub-feature 310 located inside an external quadrangle 401 which includes as part of its outer periphery the outermost portions of the sub-features 303 and 306. Likewise, the sub-features 304 and 305 are replaced by a square sub-feature 309 lying inside an external quadrangle 402 which includes as part of its outer periphery the outermost portions of the sub-features 304 and 305.

The sub-features 309 and 310 after the replacement is preferably in a square shape and the length of one side thereof is determined according to the length of the corresponding external quadrangle and is set to 30-70 nm in the example illustrated in FIG. 7. It is preferable that a central position of the sub-feature 310 after the replacement be coincident with the center of the center of the external quadrangle 401. Likewise, it is preferable that a central position of the sub-pattern 309 after the replacement be coincident with the center of the external quadrangle 402.

Alternatively, it is preferable that the central position of the sub-feature 310 after the replacement be coincident with the center of gravity of the region which includes the sub-features 303 and 306 before the replacement. Likewise, it is preferable that the central position of the sub-feature 309 after the replacement be coincident with the center of gravity of the region which includes the sub-features 304 and 305 before the replacement.

By thus making the central position of the sub-feature after the replacement coincident with the central position of the quadrangular region or with the center of gravity of the region which includes the sub-features before the replacement, it is possible to let the sub-feature after the replacement exhibit the same effect as that of the sub-features before the replacement.

As described above, attributes (size, shape, layout position) of the sub-feature after the replacement are determined on the basis of attributes (size, shape, layout position) of all the sub-features before the replacement without setting priorities.

FIGS. 8(a) and 8(b) show effects obtained by the measures of the first rule embodying the present invention. Of these figures, FIG. 8(a) shows a light intensity profile (normalized profile) on a wafer in case of using a photomask comprising a main feature MP and four sub-features SP arranged in proximity to the four sides, respectively, of the main feature MP and FIG. 8(b) shows a light intensity profile on a wafer in case of using a photomask comprising three main features MP and a total of twelve sub-features arranged virtually near the sides of the main features MP, with three sets (a total of seven) out of the twelve sub-features being replaced by three sub-features SP'.

As shown in FIG. 8(b), it is seen that even if plural orthogonal sub-features are replaced by quadrangular sub-features by application of the first rule according to this embodiment, the effects thereof (improvement of the depth of focus and suppression of dummy transfer) are maintained with respect to both light intensity profiles of best focus and −50 nm defocus.

Thus, in the first rule according to this embodiment, at a position corresponding to plural sub-features which give rise to a mutually overlapping portion when arranged virtually, the sub-features are replaced by a sub-feature which fulfills a function equal to the function of each of the sub-features, without giving priorities to the sub-features. Therefore, there is no fear that a deleted sub-feature may deteriorate the depth of focus of the main feature to which the deleted sub-feature belonged, as in case of adopting a method wherein the order of priority is set to delete any one sub-feature. That is, the sub-feature resulting from replacement can ensure a resolution margin (depth of focus margin) of the main feature to which the sub-features before the replacement belonged.

In case of adopting a method wherein only an overlapping portion of orthogonal sub-features is deleted, there sometimes is a case where the area of the remaining sub-features becomes too small in comparison with a lower-limit size in mask preparation. In this case, all of the sub-features must be deleted. However, in the first rule according to this embodiment, such deterioration of the resolution margin can be suppressed because overlapped sub-features are replaced by another sub-feature different in size, shape and layout position.

Moreover, by arranging the sub-feature resulting from replacement at the center of an external quadrangle which includes as part of its outer periphery the outermost portions of the original sub-features or at the center of gravity of a region hemmed along the original sub-features, effects equal to those of the original sub-features can be exhibited.

Further, it is possible to suppress dummy transfer of a sub-feature which occurs by allowing longitudinally perpendicularly intersecting sub-features to remain.

<First Modification of the First Rule>

If the sub-feature after the replacement in accordance with the first rule described above is close to plural main patterns, it is possible that the sub-feature will be interfered with the plural nearby main features, with consequent deterioration of the dummy transfer margin of the sub-feature. More specifically, under the proximity effect from the main features, there is a fear in the sub-features surrounded by plural main features that the peak light intensity at the corresponding position of a wafer may increase, resulting in occurrence of dummy transfer. Such a phenomenon is marked especially in the case of an attenuated type phase shift mask. If sub-peaks from plural main features (light intensity peaks appearing at positions apart from the corresponding positions of the main features) overlap each other, resolution on the wafer may result despite the absence of main pattern. If a sub-feature is arranged at such an overlapping position of sub-peaks from main features, the fear of dummy transfer of the sub-feature further increases.

In such a case, it is preferable to make replacement into a sub-feature by applying the first rule described above and further change the sub-feature after the replacement.

Figure 9:
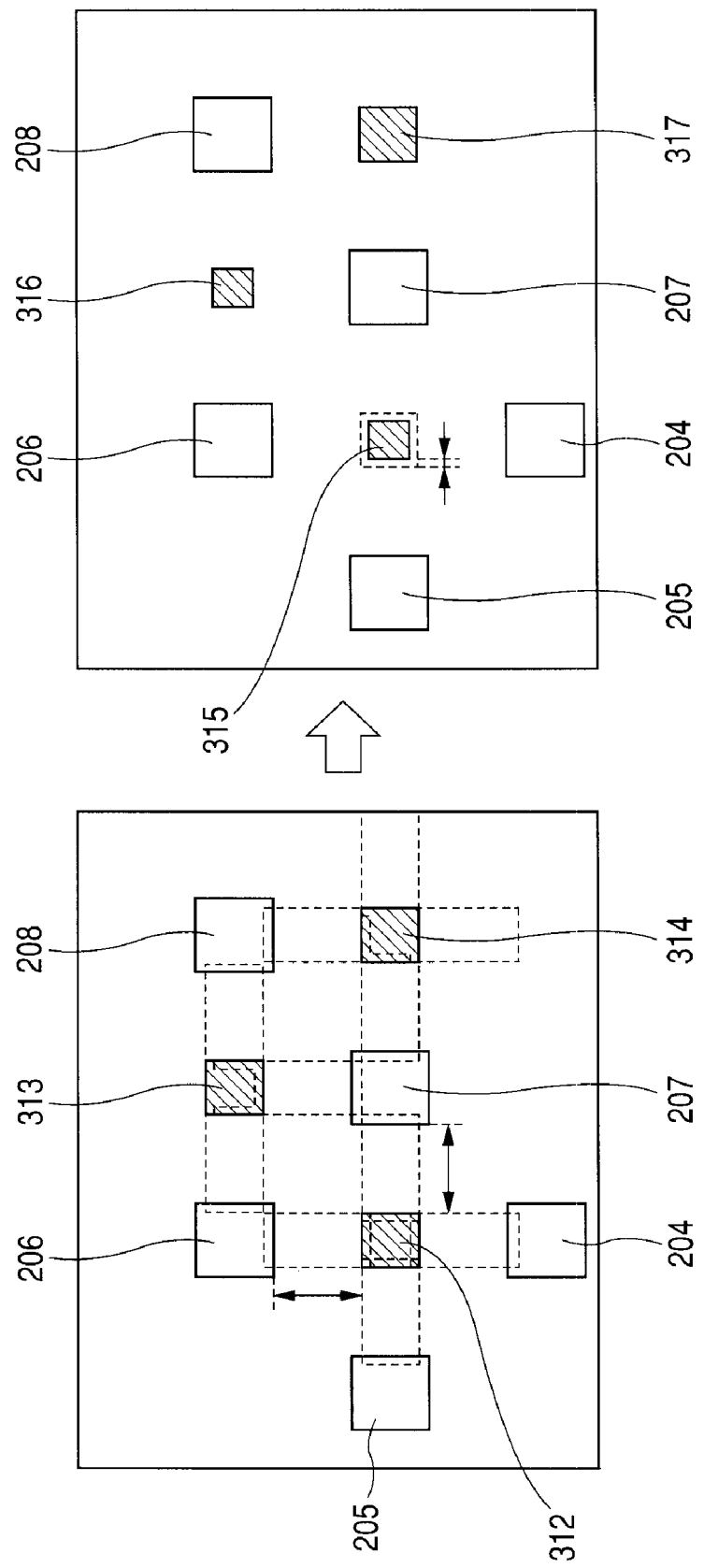
FIG. 9 is a diagram explaining the measures of a first modification of the first rule embodying the present invention.

FIG. 9 is a diagram explaining the measures of a first modification of the first rule embodying the present invention.

In the photomask shown in FIG. 9, there are arranged main features 204, 205, 206, 207 and 208 and also arranged sub-features 312, 313 and 314 as sub-features resulting from replacement of sub-features associated with the main features in accordance with the first rule.

According to the first modification of the first rule, when any of the sub-features after the replacement satisfies the following condition, "the distance between that sub-feature and main features is smaller than a predetermined threshold distance" and "the number of main features which surround the sub-feature concerned exceeds a predetermined threshold number," the size and shape of the sub-feature concerned are changed (diminished). As an example, when the length of one side of each main feature is 50-90 nm and the length of one side of the sub-feature after the replacement is 30-70 nm, it is preferable to set the above predetermined threshold distance at 250 nm, the above predetermined threshold number at three and diminish the sub-feature 2-10 nm.

Thus, in the first modification of the first rule according to this embodiment, the size and shape of each main feature after the replacement are further changed in accordance with the distance between the sub-feature and each main feature and the number of nearby main features, whereby dummy transfer of the sub-feature can be suppressed.

<Second Modification of the First Rule>

Although in FIGS. 6 and 7 referred to above there is shown an example of a photomask having square main patterns, a description will be given below about the case where the invention is applied to a photomask having main features of relatively long sides such as, for example, linear wiring.

Figure 10:
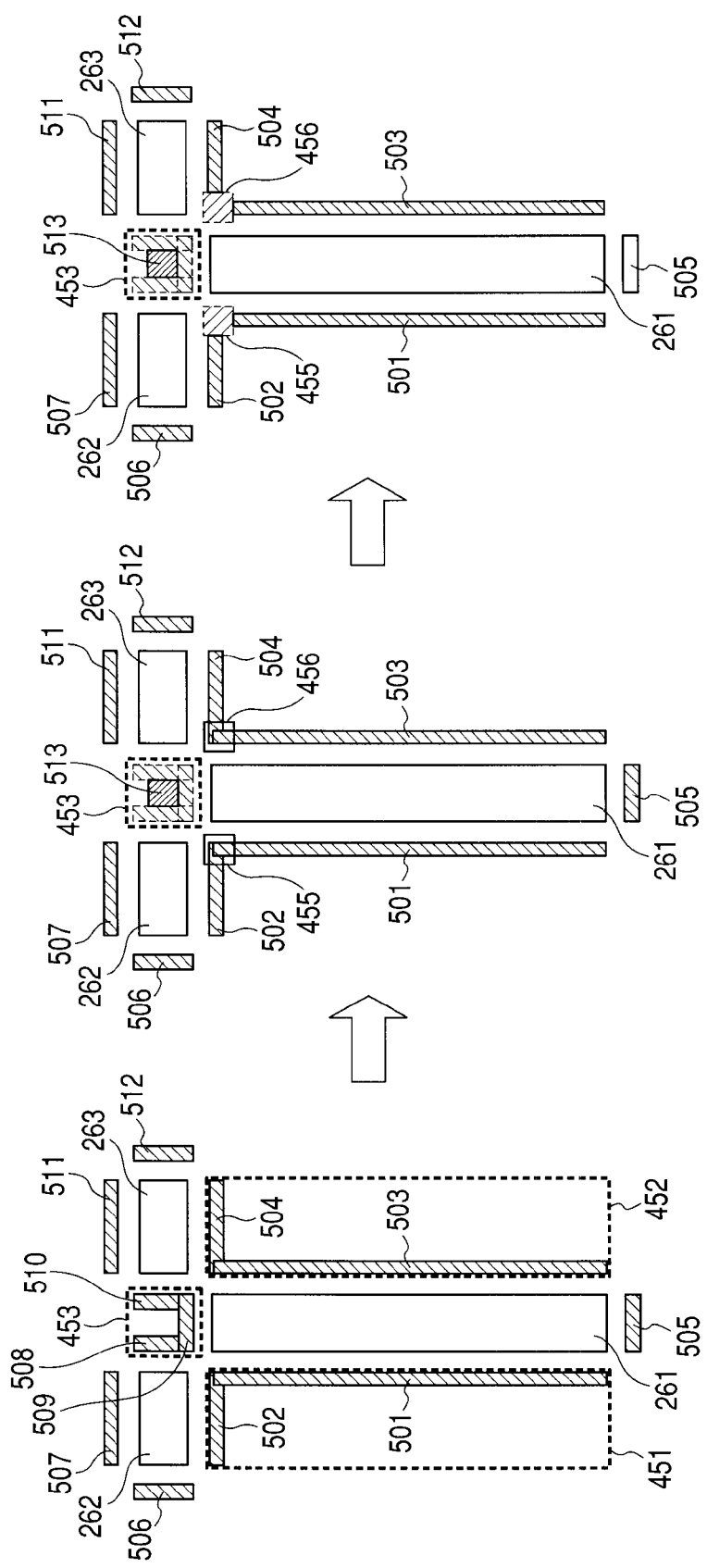
FIG. 10 is a diagram explaining the measures of a second modification of the first rule embodying the present invention.

FIG. 10 is a diagram explaining the measures of a second modification of the first rule embodying the present invention.

In the photomask shown in FIG. 10 there are arranged main features 261, 262 and 263. According to the second modification of the first rule, first sub-features each having an unresolving width (20-80 nm) are arranged on a wafer at positions spaced 40-100 nm from edges of the main features 261, 262 and 263 (FIG. 10(a)). More specifically, in the photomask shown in FIG. 10(a), there are arranged sub-features 501, 509, 503 and 505 associated with the main feature 261, sub-features 502, 506, 507 and 508 associated with the main feature 262, and sub-features 504, 510, 511 and 512 associated with the main feature 263.

Among the sub-features thus arranged there can be those which intersect or contact each other substantially perpendicularly in their longitudinal directions. In view of this point, according to the second modification of the first rule, like the above first rule, a substitute sub-feature is arranged in an inside region having an external quadrangular shape and those outer periphery includes the outermost portions of plural sub-features intersecting each other perpendicularly.

In the example shown in FIG. 10(a), the sub-features 508, 509 and 510 are replaced by a quadrangular sub-feature 513 lying inside an external quadrangle 453 which includes as part of its outer periphery the outermost portions of those original sub-features (FIG. 10(b)). In the illustrated example, the sub-feature 513 is in a square shape having a side length of 20-80 nm. A central position at which the sub-feature 513 is arranged is made coincident with the center of the external quadrangle 453 or the center of gravity of the (hemmed) region including the original sub-features.

Further, according to the second modification of the first rule, in the case where the long-side length of an external quadrangle whose outer periphery includes the outermost portions of plural orthogonal sub-features exceeds a predetermined threshold length (e.g., 100-200 nm), replacement by a sub-feature is not performed, but the region which includes the overlapping portion is deleted. This is because even if a part of the sub-features is deleted, the sub-features fully exhibit the function as sub-resolution assist features insofar as their long sides are somewhat long.

In the example shown in FIG. 10(a), as to an external quadrangle 451 which includes as part of its outer periphery the outermost portions of the sub-features 501 and 502 and an external quadrangle 452 which includes a part of its outer periphery the outermost portions of the sub-features 501 and 502, replacement by the quadrangular sub-feature located inside is not performed, but regions 455 and 456 which include overlapping portions of sub-features respectively are deleted. More specifically, there is deleted a region 455 which is larger by a predetermined amount (e.g., 5-30 nm) than the orthogonally overlapping portion of sub-features 501 and 502 of the external quadrangle 451 shown in FIG. 10(b). Likewise, there is deleted a region 456 which is larger by a predetermined amount than the orthogonally overlapping portion of sub-features 503 and 504 of the external quadrangle 452.

The photomask layout determined in accordance with the above second modification of the first rule is shown in FIG. 10(c).

Thus, in the second modification of the first rule according to this embodiment, in addition to the effects of the first rule described above, a resolution margin (depth of focus margin) of the main feature to which each sub-feature belongs can be ensured more effectively by either replacing overlapping sub-features with a different sub-feature in accordance with the size of an external quadrangle which includes as part of its outer periphery the outermost portions of the overlapping sub-features or deleting the region which includes the overlapping portion.

Even in the case where the replacement of sub-features is not performed, it is possible to avoid dummy transfer of a sub-feature because an orthogonally overlapping portion is deleted.

<Second Rule>

Figure 11:
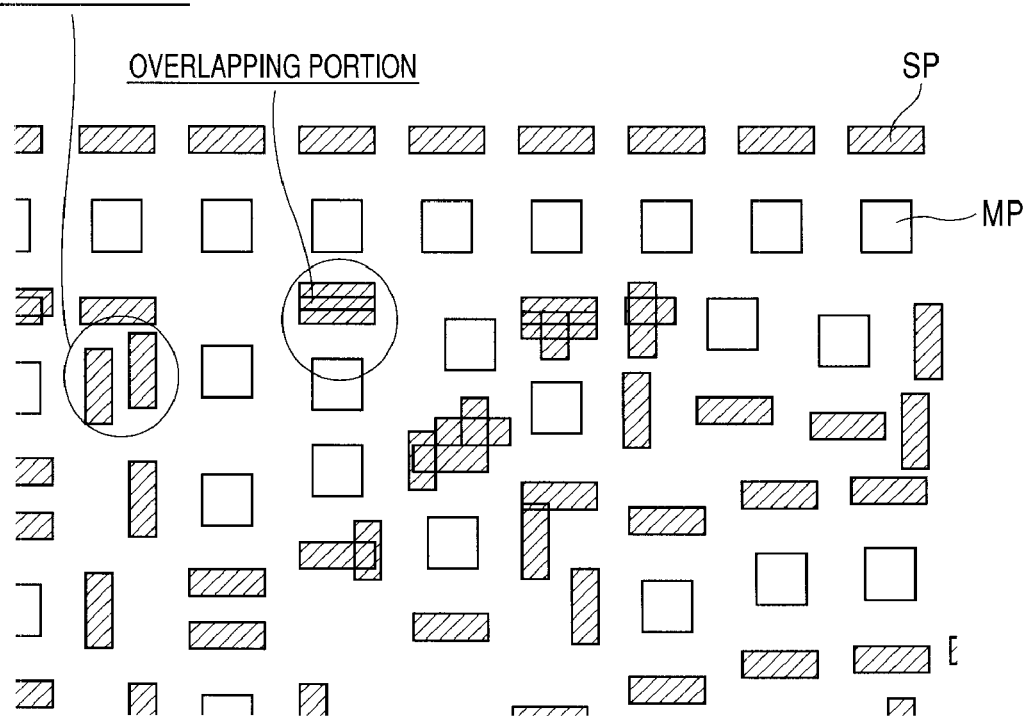
FIG. 11 is a diagram showing an example of layout in case of arranging sub-features in accordance with a predetermined sub-feature layout rule with respect to main features MP arranged randomly.

FIG. 11 shows an example of layout in which sub-features SP are arranged in accordance with a predetermined sub-feature layout rule with respect to main features MP arranged randomly. The layout shown in FIG. 11 is the same as the layout shown in FIG. 6.

Referring to FIG. 11, in the case where sub-features SP having an unresolving width (20-70 nm) are arranged on a wafer at positions each spaced 100-200 nm from the center of the associated main feature MP in parallel with sides of the main features and in accordance with a predetermined sub-feature layout rule as in the above example, there can occur a portion ("proximate portion" in FIG. 11) in which sub-features SP are substantially close in parallel to each other in their longitudinal directions or an overlapping portion ("overlapping portion" in FIG. 11).

In the case of the proximate portion in FIG. 11, the sub-feature spacing is too small and there can occur a limit value offense (MRC offense: Mask Rule Check offense) in mask preparation. As a countermeasure to MRC offense it is conceivable to delete the whole or a part of the sub-features concerned or add the proximate portion between the sub-features as part of the sub-features. However, as to the former countermeasure, a desired resolution margin for the corresponding main pattern is deteriorated, and as to the latter countermeasure, there can occur dummy transfer due to a wider stroke width of the sub-features.

As to the overlapping portion shown in FIG. 11, there is a fear that there may occur dummy transfer of a sub-feature like the case where the aforesaid proximate portion between sub-features is added as part of the sub-features.

The second rule is the measures against a substantially parallel wise proximate or overlapping portion in the longitudinal directions of sub-features in connection with such a proximate or overlapping portion of the sub-features SP.

Figure 12:
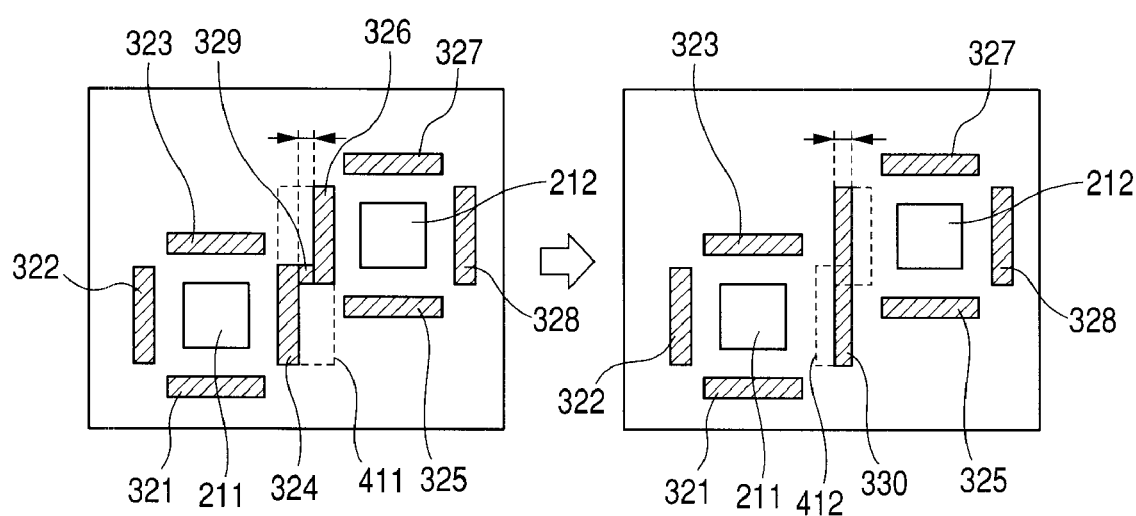
FIG. 12 is a diagram explaining the measures of a second rule embodying the present invention.
Figure 13:
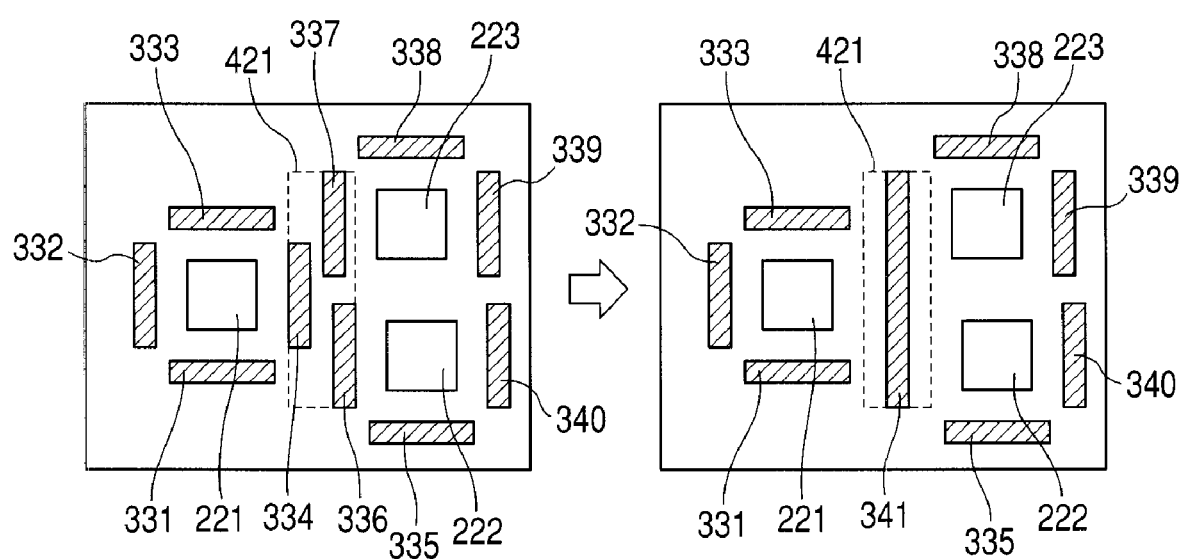
FIG. 13 is a diagram explaining the measures of the second rule embodying the present invention.

FIGS. 12 and 13 are diagrams explaining the measures of the second rule embodying the present invention.

In the photomask shown in FIG. 12 there are arranged main patterns 211 and 212, as well as sub-features 321, 322, 323 and 324 associated with the main feature 211 and sub-features 325, 326, 327 and 328 associated with the main feature 212. In this photomask, the sub-features 324 and 326 are close substantially in parallel to each other in their longitudinal directions. As a result, the size of a region 329 between the sub-features 324 and 326 becomes too small, causing an MRC offense.

According to the second rule, such plural sub-features which are close substantially in parallel to each other in the longitudinal direction are replaced with a sub-feature different in size, shape and layout position from those sub-features. More specifically, a substitute sub-feature is arranged in an inside region of an external quadrangle whose outer periphery includes the outermost portions of the parallel wise adjacent sub-features.

In the example shown in FIG. 12, the sub-features 324 and 326 are replaced by a quadrangular sub-feature 330 lying inside an external quadrangle 411 which includes as part of its outer periphery the outermost portions of the sub-features 324 and 326.

It is preferable that the sub-feature after the replacement be in a quadrangular shape parallel to all of the sub-features before the replacement. In the example shown in FIG. 12, the width (short-side length) of the sub-feature after the replacement is set at 20-60 nm. A long-side length of the sub-feature after the replacement is determined according to the long-side length of each sub-feature before the replacement (i.e., a long-side length of the external quadrangle whose outer periphery includes the outermost portions of the sub-features before the replacement). To be more specific, it is preferable that the long-side length of the sub-feature after the replacement be larger than that of the external quadrangle. As an example, the long-side length of the sub-feature after the replacement is set at +100 nm or so on the basis of the corresponding external quadrangle.

It is preferable that a central position where the sub-feature after the replacement is arranged be made coincident with the center of the external quadrangle 411 or the center of gravity of the region which includes the sub-feature before the replacement.

On the other hand, in the photomask shown in FIG. 13 there are arranged main features 221, 222 and 223, as well as sub-features 321, 332, 333 and 334 associated with the main feature 221, sub-features 335, 336 and 340 associated with the main feature 222, and sub-features 337, 338 and 339 associated with the main feature 223. In this photomask, the sub-features 334, 336 and 337 are close substantially in parallel to one another in their longitudinal directions.

According to the second rule, even in the case where such three sub-features are close substantially in parallel to one another in their longitudinal directions, the sub-features concerned are replaced by a sub-feature different in size, shape and layout position.

In the example shown in FIG. 13, the sub-features 334, 336 and 337 are replaced by a quadrangular sub-feature 341 present inside a virtual external quadrangle 421 which includes as part of its outer periphery the outermost portions of the sub-features 334, 336 and 337, the sub-feature 341 being parallel to all of the original sub-features. A long-side length of the sub-feature 341 is set so as to be approximately coincident with the long-side length of the external quadrangle 421.

As described above, attributes (size, shape, layout position) of the sub-feature after the replacement are determined on the basis of attributes (size, shape, layout position) of all the sub-features before the replacement without setting priorities.

FIGS. 14(a) and 14(b) are diagrams showing effects obtained by the measures of the second rule embodying the present invention. Of these figures, FIG. 14(a) shows a light intensity profile (a normalized profile) on a wafer in case of using a photomask having a main feature MP and four sub-features SP close to the fours sides, respectively, of the main feature MP and FIG. 14(b) shows a light intensity profile on a wafer in case of using a photomask having nine main features MP and sub-features located close to sides of the nine main features, wherein the sub-features SP exclusive of those arranged on the outer periphery side were replaced by sub-features SP' respectively.

As shown in FIG. 14(b), even if plural parallel sub-features are replaced by quadrangular sub-features by applying the second rule according to this embodiment, the effects thereof (improvement of the depth of focus and suppression of dummy transfer) are maintained with respect to both light intensity profile of best focus and that of −50 nm defocus.

Thus, in the second rule according to this embodiment, plural overlapping sub-features are replaced by a sub-feature which fulfills functions equal to those fulfilled by the overlapping sub-features, without giving priorities to the overlapping sub-features. Therefore, there is no fear that the depth of focus of the main feature to which the deleted sub-features belonged may be deteriorated as in case of adopting such a method as sets the order of priority to delete any one sub-feature. That is, the sub-feature resulting from the replacement can ensure the resolution margin (depth of focus margin) of the main feature to which the original sub-features belonged. Besides, it is possible to attain a layout free from MRC offense.

Moreover, by replacing plural sub-features by one quadrangular sub-feature it is possible to reduce the number of drawing figures in mask preparation and thereby shorten the mask drawing time. As a result, it is possible to prepare a photomask having a high resolution accuracy in comparison with crankwise coupled sub-features.

<First Modification of the Second Rule>

In the case where the sub-feature after the replacement in accordance with the above second rule is in proximity to plural main patterns, the sub-feature is interfered by the main features and the dummy transfer margin thereof can be deteriorated. More specifically, the sub-features surrounded by the main features increase in peak light intensity at the corresponding position on the wafer and dummy transfer may occur.

In such a case it is preferable that the sub-feature resulting from replacement by application of the above second rule be changed.

Figure 15:
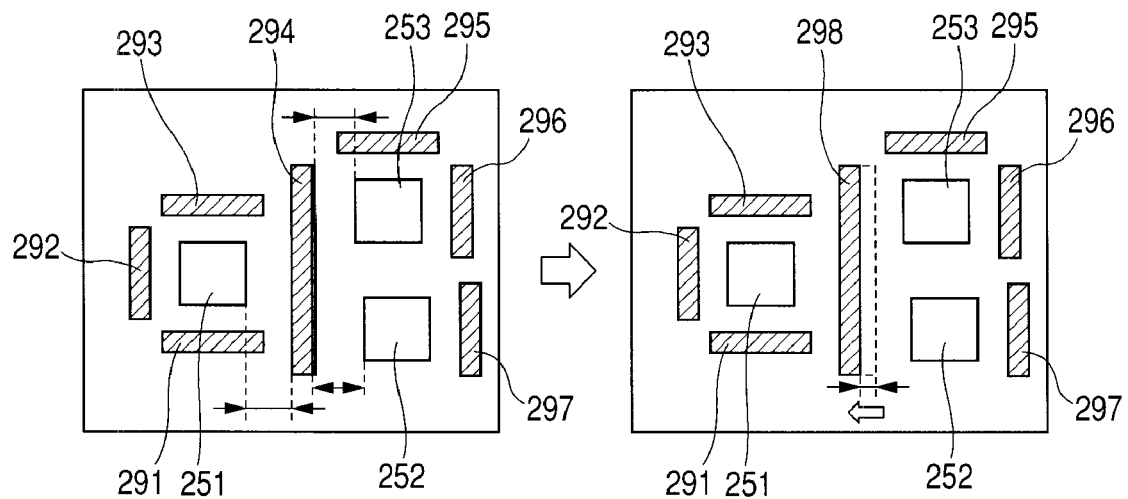
FIG. 15 is a diagram explaining the measures of a first modification of the second rule embodying the present invention.

FIG. 15 is a diagram explaining the measures of a first modification of the second rule embodying the present invention.

Figure 16:
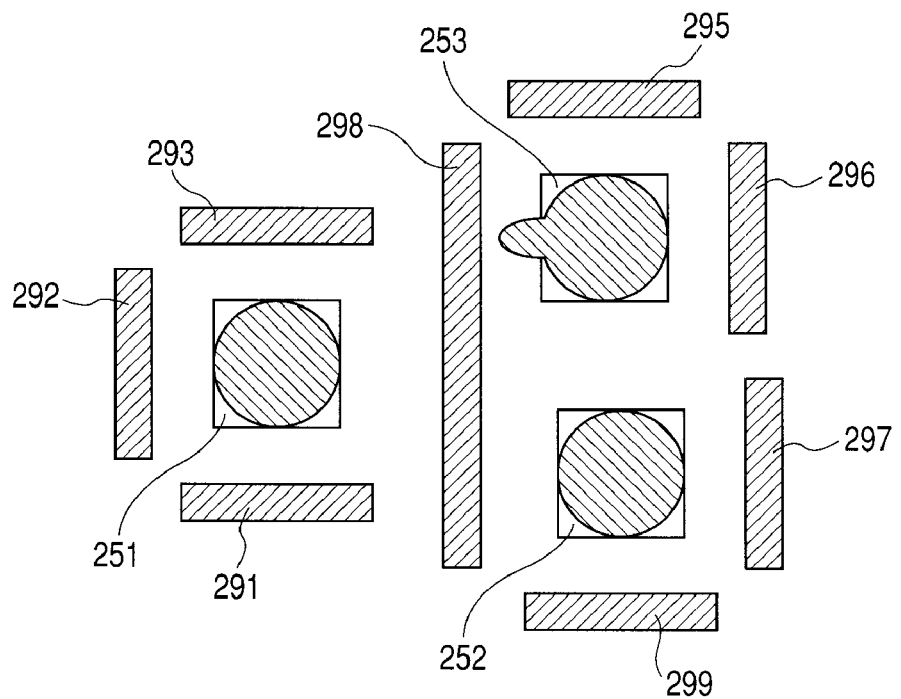
FIG. 16 is a diagram for explaining a transformation of a main feature on a wafer which occurs due to approaching between a sub-feature after replacement and the main feature.

FIG. 16 is a diagram for explaining deformation of a main feature on a wafer caused by approaching between a sub-feature resulting from replacement and the main feature.

In the photomask shown in FIG. 15 there are arranged main features 251, 252, 253 and a sub-feature 294 resulting from replacement of sub-features associated with the main features in accordance with the second rule. If the sub-feature 294 and each of the main features 251, 252, 253 approach each other to excess, dummy transfer can occur on the transfer under interference from the sub-feature. In the photomask example shown in FIG. 15, the distance between the main feature 253 and the sub-feature 294 is the smallest. As a result, there is a fear that the pattern on the wafer associated with the main feature 253 may be transformed as in FIG. 16.

According to the first modification of the second rule, when the following condition is satisfied, "the distance between the sub-feature and each main feature is smaller than a predetermined threshold distance," at least one of movement of the sub-feature concerned and reduction in size thereof is executed for the sub-feature after the replacement. As an example, when the distance between the sub-feature after the replacement and each main feature has become smaller than 100 nm, the sub-feature concerned is moved about 30 nm apart from each main feature, or the width of the sub-feature concerned is narrowed by about 15 nm. Both such movement and reduction in width of the sub-feature concerned may be done simultaneously.

Thus, in the first modification of the second rule according this embodiment, dummy transfer of a sub-feature can be suppressed by further changing the size of the sub-feature after the replacement in accordance with the distance between the sub-feature and each main feature, and/or the number of main features.

<Second Modification of the Second Rule>

Although in FIGS. 11 and 12 referred to above there has been shown an example a photomask with quadrangular main features arranged thereon, a description will be given below about the case where the invention is applied to a photomask with main features having relatively long sides such as wiring arranged thereon.

FIG. 17 is a diagram explaining the measures of a second modification of the second rule embodying the present invention.

In the photomask shown in FIG. 17 there are arranged main features 271, 272 and 273. According to the second modification of the second rule, first sub-features having an unresolving width (20-80 nm) are arranged on a wafer at positions spaced 40-100 nm from edges of the main features 271, 272 and 273 (FIG. 17(a). More specifically, in the photomask shown in FIG. 17(a), there are arranged sub-features 511, 512, 513 and 514 associated with the main feature 271, sub-features 515, 516, 517 and 518 associated with the main feature 272, and sub-features 519, 520, 521 and 523 associated with the main feature 273.

Among the sub-features thus arranged there can be those close to or overlapping each other substantially in parallel in their longitudinal directions. According to the second modification of the second rule, like the second rule described above, plural sub-features close to or overlapping each other substantially in parallel are replaced with a sub-feature different in size, shape and layout position.

In the example shown in FIG. 17(a), the sub-features 514 and 516 are replaced by a rectangular sub-feature 523 lying inside an external rectangle 450 which includes as part of its outer periphery the outermost portions of those original sub-features (FIG. 17(b)). In this case, the width (short-side length) of the sub-feature 523 is set at 20-80 nm and its long-side length is made approximately coincident with the long-side length of each of the original sub-features 514 and 516. A central position where the sub-feature 523 is arranged is made coincident with the center of an external quadrangle 453.

Further, the sub-features 513, 517 and 519 are replaced by a quadrangular sub-feature 524 (FIG. 17(b)). In this case, the width (short-side length) of the sub-feature 524 is set at 20-80 nm and its long-side length is made approximately coincident with the long-side length of the original sub-feature 519. A central position where the sub-feature 524 is arranged is made coincident with the center of gravity of the region which includes the original sub-features 513, 517 and 519.

Thus, in the second modification of the second rule according to this embodiment, plural overlapping sub-features are replaced by a sub-feature which fulfills functions equal to the functions fulfilled by those original sub-features without giving priorities to the original sub-features. Therefore, unlike the case where there is adopted a method of setting the order of priority and deleting any one sub-feature, there is no fear that the depth of focus of the main pattern to which the deleted sub-feature belonged may be deteriorated.

Moreover, by arranging the sub-feature resulting from the replacement at the center of gravity of a hemmed region of the original sub-features, the priority of a sub-feature larger in long-side length is enhanced and the effect thereof can be maintained to a greater extent.

<Third Rule>

Figure 18:
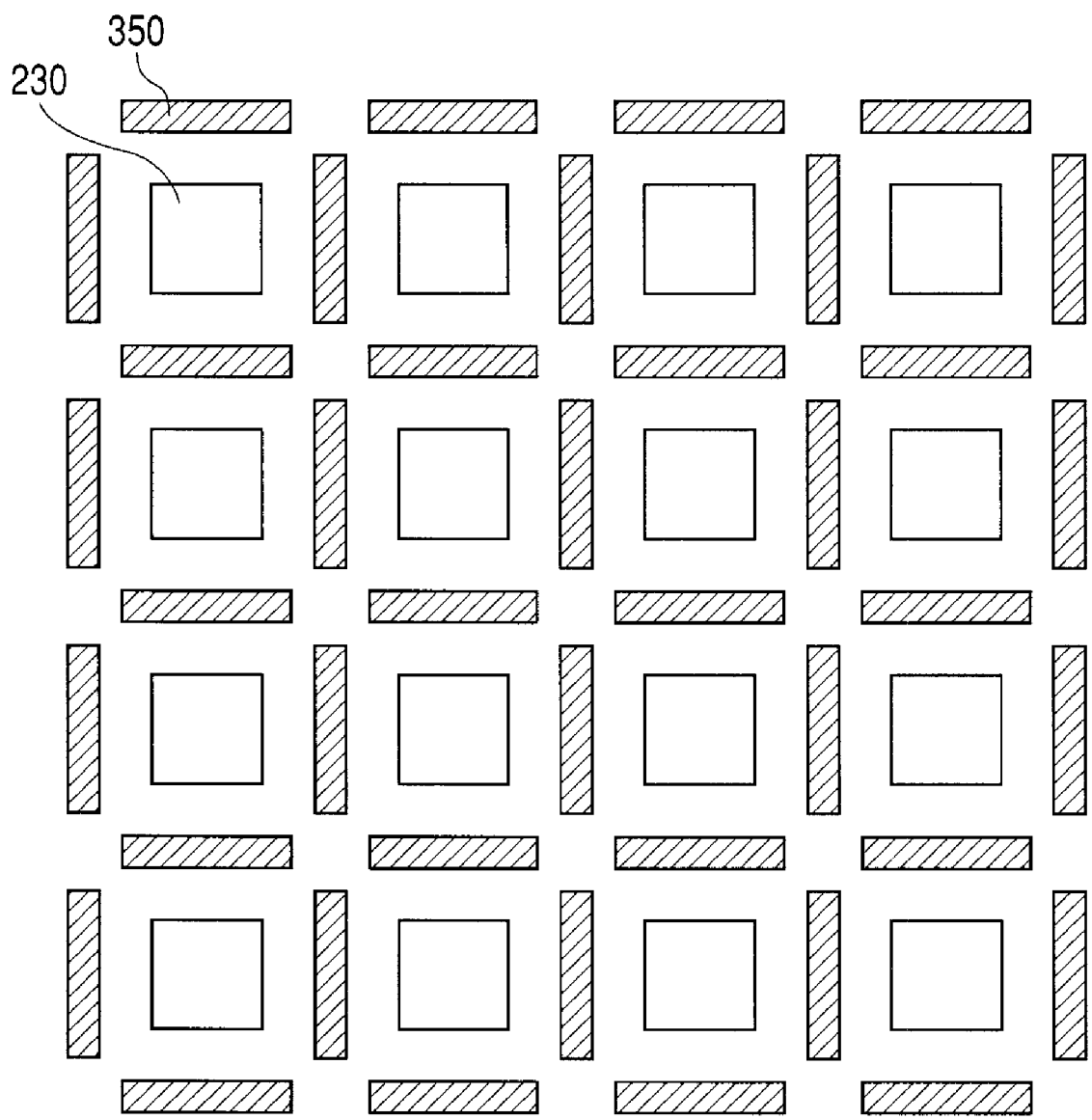
FIG. 18 is a diagram showing an example of massed main features.

FIG. 18 shows an example of massed main features. The width of each of sub-features arranged initially for such massed main features as shown in FIG. 18 is determined in the range of 20 to 70 nm after taking into account a resolution margin and a dummy transfer margin for features which are arranged at intervals of 1.5 to 2.8 times as wide as a minimum spacing (minimum pitch) between adjacent main features. The sub-feature width thus determined is narrower than an optimum width for main features arranged isolatedly.

On the other hand, for improving the resolution margin of main features arranged isolatedly, the wider the sub-feature, the more preferable. Therefore, in the case where the pitch between adjacent main features is wider than a premised value, it is preferable to make the sub-feature width larger.

According to the third rule, the pitch between adjacent main features is judged on the basis of the distance between adjacent sub-features and if the pitch between adjacent main features is wide, the sub-feature width is made larger than the initial value.

Figure 19:
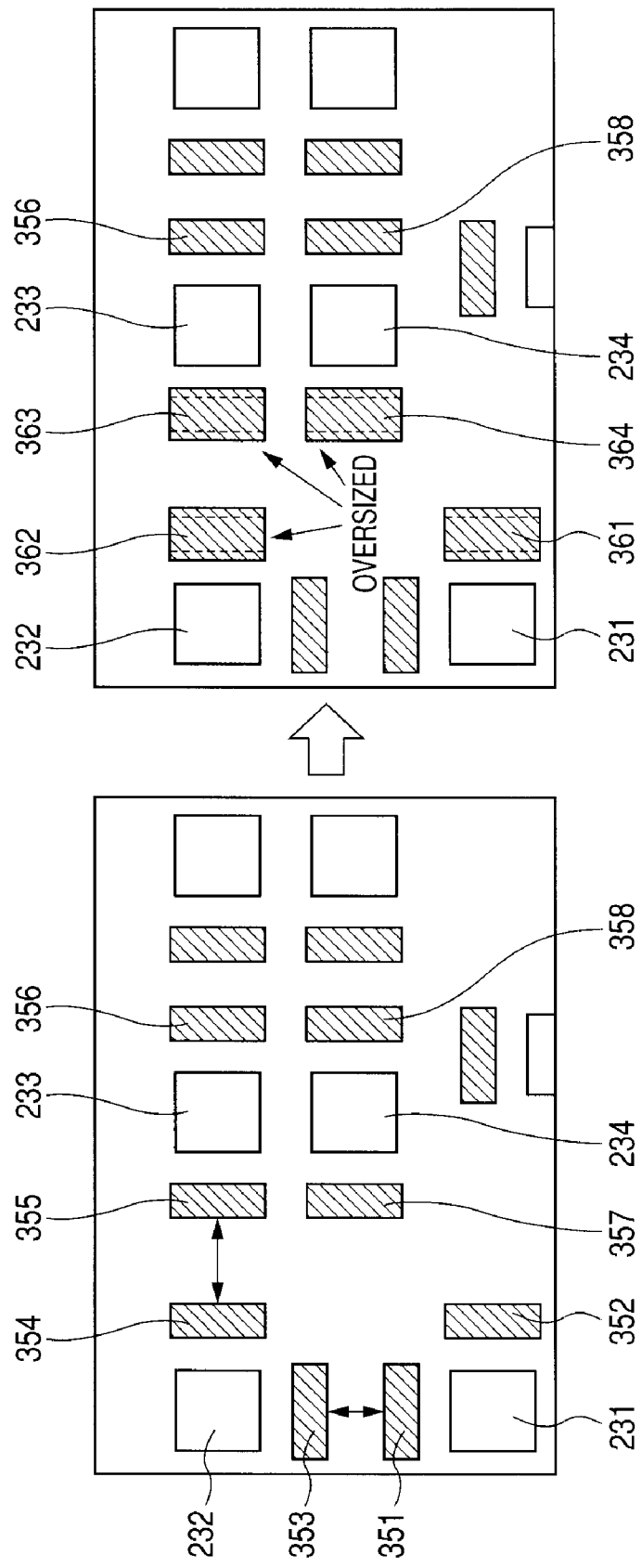
FIG. 19 is a diagram explaining the measures of a third rule embodying the present invention.

FIG. 19 is a diagram explaining the measures of the third rule embodying the present invention. Main features 231, 232, 233 and 234 are initially arranged in the photomask shown in FIG. 19. Sub-features 351 and 352 are initially arranged in association with the main feature 231, sub-features 353 and 354 are initially arranged in association with the main feature 232, sub-features 355 and 356 are initially arranged in association with the main feature 233, and sub-features 357 and 358 are initially arranged in association with the main feature 234.

For example, when the distance between the sub-features 354 and 355 exceeds a predetermined threshold distance (e.g., 80 nm), the sub-features 354 and 355 are replaced by sub-features 362 and 363, respectively, which have a larger width (e.g., up to +20 nm). Likewise, the sub-features 352 and 354 are also replaced by sub-features 361 and 362, respectively, which have a larger width (e.g., 20 nm).

On the other hand, when the distance between the sub-features 351 and 353 does not exceed the predetermined threshold distance, the width of each of these sub-features is not changed.

According to the third rule, sub-features of a width suitable for main features arranged at an intermediate pitch are arranged initially, so that the probability of occurrence of a case where sub-features cannot be arranged can be diminished even when main features are massed.

In the case where a main pattern is arranged isolatedly, a change is made to a sub-feature having a larger width, whereby it is possible to improve the resolution margin of the main feature.

<Fourth Rule>

As explained above in connection with the third rule, the width of each of sub-features initially arranged for such massed main features as in FIG. 6 is determined in the range of 20 to 70 nm after taking into account a resolution margin and a dummy transfer margin for features which are arranged at intervals of 1.5 to 2.8 times as large as a minimum spacing (minimum pitch) between adjacent main features. However, there also occurs a case where the pitch between adjacent main features is narrower than a premised value. In such a case it is preferable that the sub-feature width be made narrower in order to maintain the dummy transfer margin.

According to the fourth rule, the pitch between adjacent main features is judged on the basis of the distance between adjacent sub-features, and when the pitch in question is narrow, the width of each sub-feature is made narrower than the initial value.

Figure 20:
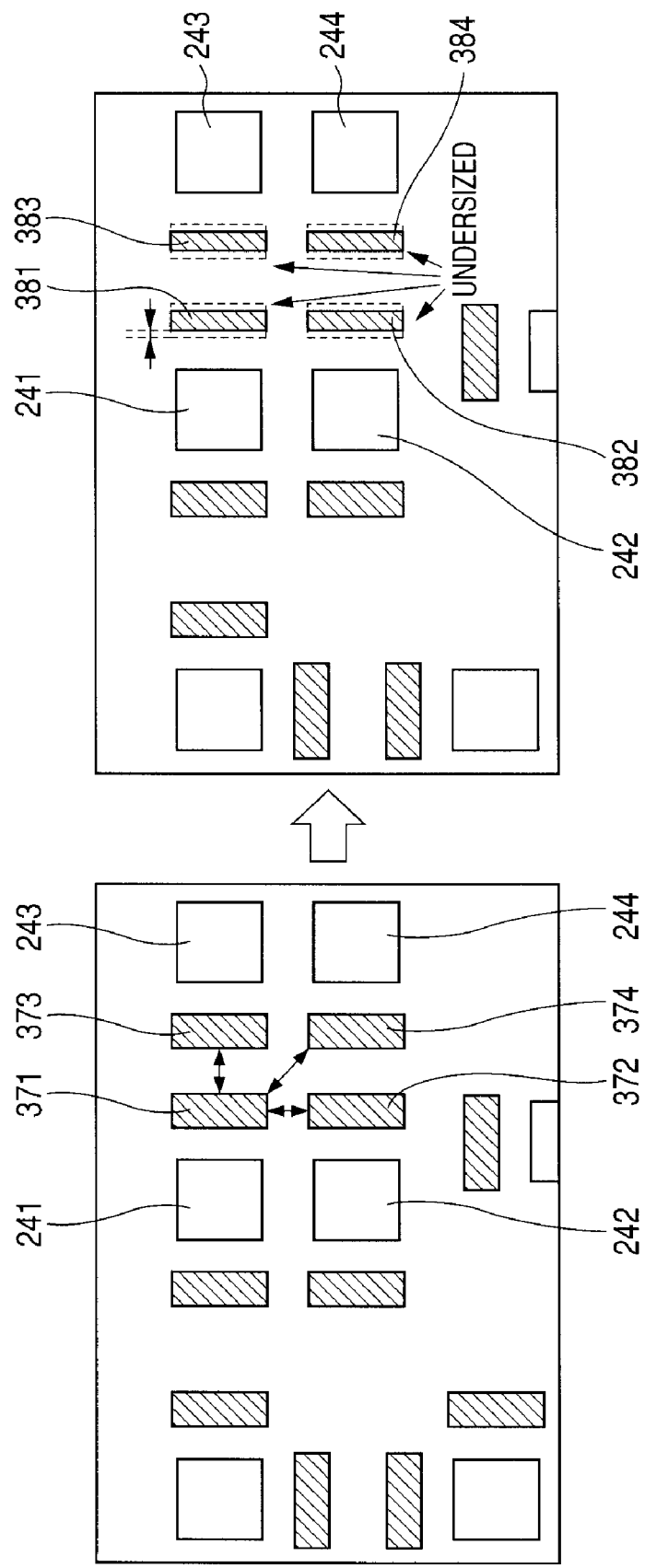
FIG. 20 is a diagram explaining the measures of a fourth rule embodying the present invention.
Figure 21:
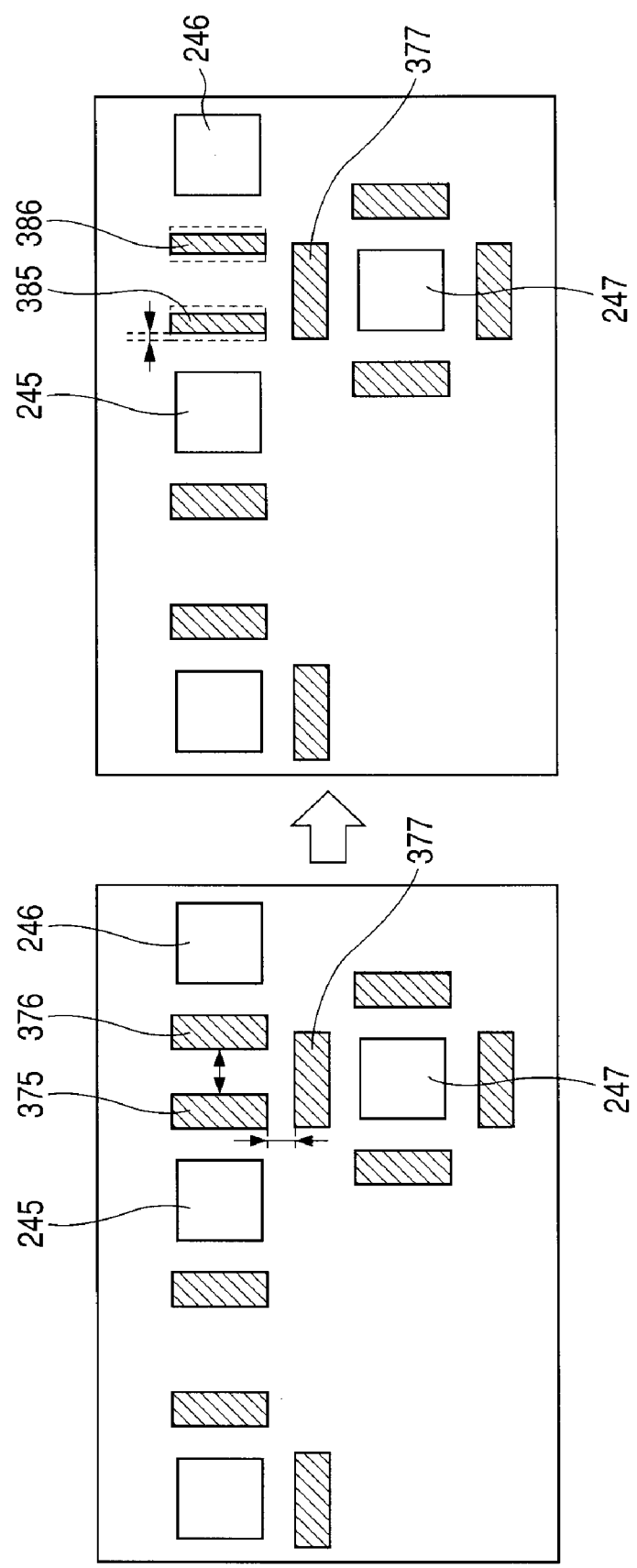
FIG. 21 is a diagram explaining the measures of the fourth rule embodying the present invention.

FIGS. 20 and 21 are diagrams explaining the measures of the fourth rule embodying the present invention.

Main features 241, 242, 243 and 244 are initially arranged in the photomask shown in FIG. 20. A sub-feature 371 is initially arranged for the main feature 241, a sub-feature 372 is initially arranged for the main feature 242, a sub-feature 373 is initially arranged for the main feature 243, and a sub-feature 374 is initially arranged for the main feature 244.

According to the third rule the width (short side) of a sub-feature concerned is made narrower than the initial value when the following conditions are satisfied: "the distance between a long side of a sub-feature and a long side of an adjacent sub-feature is smaller than a predetermined threshold distance (e.g., 20-200 nm)" and "the distance from a short side of a sub-feature to an adjacent sub-feature is smaller than a predetermined threshold distance (e.g., up to 100 nm)."

For example, in FIG. 20, when the distance between a long side of the sub-feature 371 and a long side of the adjacent sub-feature 373 is smaller than the predetermined threshold distance and the distance from a short side of the sub-feature 371 to the adjacent sub-feature is smaller than the predetermined threshold distance, the sub-feature 371 is replaced by a sub-feature 381 having a narrower width (e.g., up to −10 nm). Likewise, also as to the sub-features 372, 373 and 374, they are replaced by sub-features 382, 383 and 384, respectively, which are narrower in width.

Main features 245, 246 and 247 are initially arranged in the photomask shown in FIG. 21. A sub-feature 375 is initially arranged for the main feature 245, a sub-feature 376 is initially arranged for the main feature 246, and a sub-feature 377 is initially arranged for the main feature 247.

In FIG. 21, when the distance between a long side of the sub-feature 375 and a long side of the sub-feature 376 is smaller than the predetermined threshold distance and the distance from a short side of the sub-feature 375 to the adjacent sub-feature is smaller than the predetermined threshold distance, the sub-feature 375 is replaced by a sub-feature 385 having a narrower width (e.g., up to −10 nm). Likewise, also as to the sub-feature 376, it is replaced by a sub-feature 386 having a narrower width.

On the other hand, when neither the distance between a long side of the sub-feature 377 and a long side of the sub-feature 375 nor the distance between the long side of the sub-feature 377 and a long side of the sub-feature 376 exceeds the predetermined threshold distance, the width of the sub-feature 377 is not changed.

According to the fourth rule the width of each sub-feature is changed appropriately on the basis of the distance between adjacent sub-features. Therefore, the sub-feature width can be set appropriately even for a layout wherein the main feature pitch is difficult to evaluate. As a result, it is possible to suppress dummy transfer of a sub-feature.

According to the above embodiments, as described above, it is possible to suppress the deterioration of the depth of focus even in the case where main features are arranged randomly.

Particularly, the present invention is effective for the sub-resolution assist feature layout irrespective of whether a mask is a dark field mask or a clear field mask or whether a mask is a binary mask or an attenuated type phase shift mask.

It should be understood that the above embodiments are illustrative and not limitative in all points. The scope of the present invention is represented not by the above description but by the scope of claims and it is contemplated that meanings equal to the scope of claims and all changes falling under the scope of claims are included in the present invention.

What is claimed is:

1. A photomask for the transfer of patterns to a substrate using an exposure unit, the photomask comprising:
   a plurality of main features arranged at positions corresponding to the patterns to be transferred to the substrate;
   a plurality of first sub-features associated with any of sides of the main features and arranged at positions spaced a predetermined distance from the associated sides; and
   a second sub-feature which is selected to replace two or more of said first sub-features at a position associated with the first sub-features when said two or more first sub-features form a mutually overlapping portion when arranged virtually, the second sub-feature replacing as a substitute said two or more first sub-features, wherein attributes of the second sub-feature are determined on the basis of attributes of the virtually arranged first sub-features associated with the second sub-feature, and wherein at least one of a size and a shape of a replaced position of the second sub-feature is different from a size or a shape or replaced position of the virtually arranged first sub-features associated with the second sub-feature.

2. A photomask for the transfer of patterns to a substrate using an exposure unit, the photomask comprising:

a plurality of main features arranged at positions corresponding to the patterns to be transferred to the substrate;

a plurality of first sub-features associated with any of sides of the main features and arranged at positions spaced a predetermined distance from the associated sides; and a second sub-feature which is selected to replace two or more of said first sub-features at a position associated with the two or more first sub-features which are substantially in parallel to each other when arranged virtually, the second sub-feature replacing as a substitute said two or more first sub-features, wherein attributes of the second sub-feature are determined on the basis of attributes of the virtually arranged first sub-features associated with the second sub-feature, and wherein at least one of a size and a shape of a replaced position of the second sub-feature is different from a size or a shape or replaced position of the virtually arranged first sub-features associated with the second sub-feature.

3. The photomask according to claim 1,
wherein the second sub-feature is arranged at the center of an outline of the virtually arranged first sub-features associated with the second sub-feature.

4. The photomask according to claim 1,
wherein the second sub-feature is arranged at the center of gravity of the region of the virtually arranged first sub-features associated with the second sub-feature.

5. The photomask according to claim 1,
wherein when the virtually arranged first sub-features associated with the second sub-feature intersect each other perpendicularly, the second sub-feature is substantially square.

6. The photomask according to claim 1,
wherein when the virtually arranged first sub-features associated with the second sub-feature are parallel to each other, the second sub-feature is arranged in parallel with the associated, virtually arranged first sub-features.

7. The photomask according to claim 6,
wherein the length in the longitudinal direction of the second sub-feature is substantially coincident with the length in the longitudinal direction of an outline of the virtually arranged first sub-features associated with the second sub-feature.

8. The photomask according to claim 1,
wherein the size of the second sub-feature is determined on the basis of the distance from the main features(s) adjacent thereto and the number of the main features(s) adjacent thereto.

9. The photomask according to claim 1,
wherein the position of the second sub-feature is determined on the basis of the distance from the main feature(s) adjacent thereto.

10. The photomask according to claim 1,
wherein the size of each of the first and second sub-features is determined on the basis of the distance from the first or the second sub-feature adjacent thereto.

11. The photomask according to claim 1,
wherein the width of each of the first sub-features is determined beforehand on the premise that the main features are arranged at a predetermined pitch.

12. The photomask according to claim 2,
wherein at least one of the size and the shape of the second sub-feature is different from the size and/or the shape of the virtually arranged first sub-features associated with the second sub-feature.

13. The photomask according to claim 2,
wherein the second sub-feature is arranged at the center of an outline of the virtually arranged first sub-features associated with the second sub-feature.

14. The photomask according to claim 2,
wherein the second sub-feature is arranged at the center of gravity of the region of the virtually arranged first sub-features associated with the second sub-feature.

15. The photomask according to claim 2,
wherein when the virtually arranged first sub-features associated with the second sub-feature are parallel to each other, the second sub-feature is arranged in parallel with the associated, virtually arranged first sub-features.

16. The photomask according to claim 15,
wherein the length in the longitudinal direction of the second sub-feature is substantially coincident with the length in the longitudinal direction of an outline of the virtually arranged first sub-features associated with the second sub-feature.

17. The photomask according to claim 2,
wherein the size of the second sub-feature is determined on the basis of the distance from the main features(s) adjacent thereto and the number of the main features(s) adjacent thereto.

18. The photomask according to claim 2,
wherein the position of the second sub-feature is determined on the basis of the distance from the main feature(s) adjacent thereto.

19. The photomask according to claim 2,
wherein the size of each of the first and second sub-features is determined on the basis of the distance from the first or the second sub-feature adjacent thereto.

20. The photomask according to claim 2,
wherein the width of each of the first sub-features is determined beforehand on the premise that the main features are arranged at a predetermined pitch.

* * * * *